(12) United States Patent
Song et al.

(10) Patent No.: US 11,427,759 B2
(45) Date of Patent: Aug. 30, 2022

(54) ETCHANT COMPOSITIONS FOR METAL-CONTAINING FILMS AND METHODS OF MANUFACTURING INTEGRATED CIRCUIT DEVICES USING THE ETCHANT COMPOSITIONS

(71) Applicants: Samsung Electronics Co., Ltd., Suwon-si (KR); DONGWOO FINE-CHEM Co., Ltd., Jeollabuk-do (KR)

(72) Inventors: Kihun Song, Suwon-si (KR); Jungmin Oh, Incheon (KR); Hyosan Lee, Hwaseong-si (KR); Hyojoong Yoon, Iksan-si (KR); Minjung Kim, Bucheon-si (KR); Jongwook Baek, Incheon (KR)

(73) Assignees: Samsung Electronics Co., Ltd., Suwon-si (KR); Dongwoo Fine-Chem Co., Ltd., Jeollabuk-do (KR)

( * ) Notice: Subject to any disclaimer, the term of this patent is extended or adjusted under 35 U.S.C. 154(b) by 0 days.

(21) Appl. No.: 16/946,495

(22) Filed: Jun. 24, 2020

(65) Prior Publication Data
US 2021/0115334 A1   Apr. 22, 2021

(30) Foreign Application Priority Data
Oct. 17, 2019   (KR) .................. 10-2019-0129330

(51) Int. Cl.
*C09K 13/06* (2006.01)
*H01L 27/108* (2006.01)
*H01L 21/3213* (2006.01)

(52) U.S. Cl.
CPC ........ *C09K 13/06* (2013.01); *H01L 21/32134* (2013.01); *H01L 27/10876* (2013.01); *H01L 27/10888* (2013.01)

(58) Field of Classification Search
CPC ............. C09K 13/06; H01L 27/10876; H01L 27/10888; H01L 21/32134;
(Continued)

(56) References Cited

U.S. PATENT DOCUMENTS 8,513,139 B2   8/2013   Matsuda et al.
9,275,834 B1   3/2016   Park et al.
(Continued)

FOREIGN PATENT DOCUMENTS

JP    5343858         11/2013
KR    1020120044630    5/2012
(Continued)

OTHER PUBLICATIONS

Translation of CN107475715 (A) (Year: 2017).*

*Primary Examiner* — Duy Vu N Deo
(74) *Attorney, Agent, or Firm* — Myers Bigel, P.A.

(57) ABSTRACT

Metal-containing film etchant compositions may include hydrogen peroxide ($H_2O_2$), a phosphoric acid compound, a heterocyclic organic amine compound including at least one heteroatom in a ring, and water. Manufacturing methods of an integrated circuit (IC) may include performing a dry etch process on a conductive structure including a metal nitride film and a metal film to form a conductive pattern intermediate product and performing a wet etch process on the conductive pattern intermediate product using an etching atmosphere providing a higher etch selectivity with respect to the metal nitride film than the metal film. The etching atmosphere may include an etchant composition including hydrogen peroxide, a phosphoric acid compound, a heterocyclic organic amine compound including at least one heteroatom in a ring, and water.

20 Claims, 22 Drawing Sheets

(58) Field of Classification Search
CPC ......... H01L 27/10814; H01L 27/10891; H01L 27/10855; H01L 21/30604; H01L 21/31111
USPC .................. 438/745–754; 252/79.1–79.4
See application file for complete search history.

(56) References Cited

U.S. PATENT DOCUMENTS

| | | | |
|---|---|---|---|
| 9,831,088 | B2 | 11/2017 | Chen et al. |
| 2006/0226122 | A1 | 10/2006 | Wojtczak et al. |
| 2015/0368557 | A1 | 12/2015 | Lee et al. |
| 2016/0257880 | A1 | 9/2016 | Hong et al. |
| 2019/0010358 | A1* | 1/2019 | Iwata ................... H01L 21/3212 |
| 2019/0284704 | A1* | 9/2019 | Ge ..................... H01L 21/32134 |
| 2019/0301026 | A1* | 10/2019 | Kouno ...................... C23F 1/26 |

FOREIGN PATENT DOCUMENTS

| | | |
|---|---|---|
| KR | 101174767 | 8/2012 |
| KR | 1020130049507 | 5/2013 |
| KR | 101346976 | 12/2013 |
| KR | 101587758 | 1/2016 |
| KR | 1020160000388 | 1/2016 |
| KR | 1020170084600 | 7/2017 |
| KR | 1020170124705 | 11/2017 |
| KR | 1020180041365 | 4/2018 |
| KR | 1020180041936 | 4/2018 |
| KR | 1020180045185 | 5/2018 |
| KR | 1020180060722 | 6/2018 |

* cited by examiner

A-A'

ETCHANT COMPOSITIONS FOR METAL-CONTAINING FILMS AND METHODS OF MANUFACTURING INTEGRATED CIRCUIT DEVICES USING THE ETCHANT COMPOSITIONS

CROSS-REFERENCE TO RELATED APPLICATION

This application claims priority under 35 U.S.C. § 119 to Korean Patent Application No. 10-2019-0129330, filed on Oct. 17, 2019, in the Korean Intellectual Property Office, the disclosure of which is incorporated herein in its entirety by reference.

BACKGROUND

The inventive concept relates to an etchant composition and a method of manufacturing an integrated circuit (IC) device, and more particularly, to an etchant composition for etching a metal-containing film and a method of manufacturing an IC device.

As the downscaling of IC devices is rapidly progressing, critical dimensions (CDs) of the IC devices are being sharply reduced, widths of metal interconnection patterns of the IC devices are being gradually reduced, and aspect ratios are gradually increasing. Accordingly, a process of precisely implementing the metal interconnection patterns according to desired designs is increasing in difficulty. Therefore, it may be beneficial to develop an etchant composition, which may ensure the etching uniformity of the metal interconnection patterns while increasing an etch selectivity to a metal-containing film while not adversely affecting neighboring insulating films, and a technique of optimizing a process of manufacturing an IC device using the etchant composition.

SUMMARY

The inventive concept provides an etchant composition, which may etch a metal-containing film with a high etch selectivity without adversely affecting neighboring insulating films when the metal-containing film is etched even if both the metal-containing film and an insulating film are simultaneously exposed to an etching atmosphere. Also, the etchant composition may provide a uniform etch rate with respect to metal interconnection patterns having a relatively small width and a relatively high aspect ratio.

The inventive concept also provides a method of manufacturing an IC device, which includes etching a metal-containing film with a high etch selectivity without adversely affecting neighboring insulating films even if a width of metal interconnection patterns is gradually reduced and an aspect ratio of the metal interconnection patterns is increased with the downscaling of IC devices. Also, the method of manufacturing the IC device may provide a uniform etch rate with respect to metal interconnection patterns having a relatively small width and a relatively high aspect ratio and may include performing stable processes by reducing or preventing problems, such as pattern leaning or the occurrence of undesired chemical reactions, after the etching of the metal-containing film and/or during rinse and dry processes.

According to some embodiments of the inventive concept, there is provided a metal-containing film etchant composition including hydrogen peroxide ($H_2O_2$), a phosphoric acid compound, a heterocyclic organic amine compound containing at least one hetero atom in a ring, and water.

According to some embodiments of the inventive concept, there is provided a metal-containing film etchant composition including aqueous hydrogen peroxide ($H_2O_2 \cdot nH_2O$), a phosphoric acid compound, and a heterocyclic organic amine compound containing two hetero atoms in a ring.

According to some embodiments of the inventive concept, there is provided a metal-containing film etchant composition including about 0.1% by weight to about 20% by weight of aqueous hydrogen peroxide having a purity of 31%, based on a total weight of the metal-containing film etchant composition, about 70% by weight to about 99% by weight of phosphoric acid having a purity of 85%, based on the total weight of the metal-containing film etchant composition, and about 0.01% by weight to about 10% by weight of heterocyclic organic amine compound, based on the total weight of the metal-containing film etchant composition. The heterocyclic organic amine compound includes a six-membered heterocyclic organic tertiary amine compound containing at least one nitrogen atom in a ring.

According to some embodiments of the inventive concept, there is provided a method of manufacturing an integrated circuit (IC) device. The method includes forming an insulating film on a substrate. A conductive structure including a metal nitride film and a metal film is formed on the insulating film. A conductive pattern may be formed by etching a first portion of the metal nitride film and a first portion of the metal film, and the conductive pattern may include a second portion of the metal nitride film and a second portion of the metal film. The first portion of the metal nitride film may be different from the second portion of the metal nitride film. The first portion of the metal film may be different from the second portion of the metal film. The forming of the conductive pattern may include forming a conductive pattern intermediate product by performing a dry etch process on the conductive structure using a first etching atmosphere providing a higher etch selectivity to the metal film with respect to the metal nitride film; and performing a wet etch process on the conductive pattern intermediate product using a second etching atmosphere providing a higher etch selectivity to the metal nitride film with respect to the metal film. The second etching atmosphere includes an etchant composition including hydrogen peroxide ($H_2O_2$), a phosphoric acid compound, a heterocyclic organic amine compound containing at least one hetero atom in a ring, and water.

According to some embodiments of the inventive concept, there is provided a method of manufacturing an IC device. The method includes forming a plurality of bit line structures on a substrate, the plurality of bit line structures including a plurality of bit lines and a plurality of insulating structures on the plurality of bit lines, respectively. A plurality of contact plugs are formed between pairs of the plurality of bit lines structures, respectively. A conductive structure is formed. The conductive structure includes a metal nitride film and a metal film, which sequentially stacked on the plurality of bit lines structures and the plurality of contact plugs. A plurality of conductive landing pads are formed by etching a first portion of the metal nitride film and a first portion of the metal film. The plurality of conductive landing pads include respective second portions of the metal nitride film and respective second portions of the metal film and are connected to the plurality of contact plugs, respectively. The formation of the conductive landing pads includes performing a dry etch process on the conductive structure using a first etching atmosphere providing a higher etch rate of the metal film that an etch rate of the metal nitride, and performing a wet etch process on the conductive structure using a second etching atmosphere providing a higher etch rate of to the metal nitride film than an etch rate of the metal film to expose the plurality of insulating structures. The second etching atmosphere includes an etchant composition including hydrogen peroxide, a phosphoric acid compound, a heterocyclic organic amine compound containing at least one heteroatom in a ring, and water.

According to some embodiments of the inventive concept, there is provided a method of manufacturing an IC device. The method includes forming a word line trench in a substrate. A gate dielectric film is formed within the word line trench. A conductive structure is formed in the word line trench. The conductive structure includes a metal nitride film and a metal film sequentially stacked on the gate dielectric film. A word line is formed in the word line trench by etching a first portion of the metal nitride film and a first portion of the metal film. The word line includes a second portion of the metal nitride film and a second portion of the metal film. The first portion of the metal nitride film may be different from the second portion of the metal nitride film. The first portion of the metal film may be different from the second portion of the metal film. The formation of the word line includes performing a dry etch process on the conductive structure using a first etching atmosphere providing a higher etch rate of the metal film than an etch rate of the metal nitride film, and performing a wet etch process on the conductive structure using a second etching atmosphere providing a higher etch rate of the metal nitride film than an etch rate of the metal film to expose the gate dielectric film. The second etching atmosphere includes an etchant composition including hydrogen peroxide ($H_2O_2$), a phosphoric acid compound, a heterocyclic organic amine compound containing at least one heteroatom in a ring, and water.

BRIEF DESCRIPTION OF DRAWINGS

Some example embodiments of the inventive concept will be more clearly understood from the following detailed description taken in conjunction with the accompanying drawings in which.

DETAILED DESCRIPTION

Figure 1A:
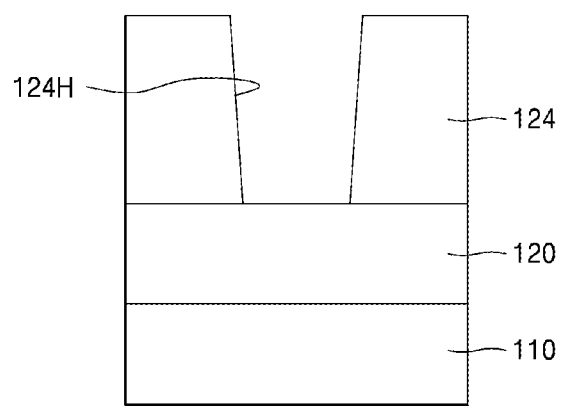
FIGS. 1A to 1E are cross-sectional views illustrating a method of manufacturing an integrated circuit (IC) device according to some embodiments of the inventive concept.

Hereinafter, some example embodiments will be described in detail with reference to the accompanying drawings. The same reference numerals are used to denote the same elements in the drawings, and repeated descriptions thereof may be omitted.

A metal-containing film etchant composition according to some embodiments may include hydrogen peroxide ($H_2O_2$), a phosphoric acid-based compound, a heterocyclic organic amine compound containing at least one heteroatom in a ring, and water.

The metal-containing film etchant composition according to some embodiments of the inventive concept may be used to selectively etch a titanium nitride (TiN) film and a tungsten (W) film on a substrate. The metal-containing film etchant composition according to some embodiments of the inventive concept may etch a titanium nitride (TiN) film and a tungsten (W) film with an etch rate greater than an etch rate for other elements (e.g., an insulating pattern).

In the metal-containing film etchant composition according to some embodiments, hydrogen peroxide may oxidize and etch the TiN film and the W film. The hydrogen peroxide may be contained at a content of about 0.03% by weight to about 7% by weight based on a total weight of the metal-containing film etchant composition. When the metal-containing film etchant composition contains hydrogen peroxide at a content of less than about 0.03% by weight, an oxidation rate and an etch rate of each of the TiN film and the W film may be reduced. When the content of hydrogen peroxide exceeds about 7% by weight, the etch rate of each of the TiN film and W film may be excessively increased, and thus, it may be difficult to adjust an etch selectivity.

In example embodiments, hydrogen peroxide in the metal-containing film etchant composition according to some embodiments may be included in the form of aqueous hydrogen peroxide ($H_2O_2.nH_2O$). In this case, the metal-containing film etchant composition may not include additional water. A purity of hydrogen peroxide may be about 31% in aqueous hydrogen peroxide included in the metal-containing film etchant composition. Aqueous hydrogen peroxide included in the metal-containing film etchant composition may oxidize and etch a TiN film and a W film. The aqueous hydrogen peroxide may be contained at a content of about 0.1% by weight to about 20% by weight based on a total weight of the metal-containing film etchant composition. When the aqueous hydrogen peroxide is included at a content of less than about 0.1% by weight in the metal-containing film etchant composition, an oxidation rate and an etch rate of each of the TiN film and the W film may be reduced. When the content of the aqueous hydrogen peroxide exceeds about 20% by weight, the etch rate of each of the TiN film and W film may be excessively increased, and thus, it may be difficult to adjust an etch selectivity.

In example embodiments, in the metal-containing film etchant composition according to some embodiments, the phosphoric acid-based compound may include inorganic phosphoric acid. For example, the phosphoric acid-based compound may include phosphoric acid ($H_3PO_4$), pyrophosphoric acid ($H_4P_2O_7$), polyphosphoric acid, or a combination thereof. The polyphosphoric acid may be a phosphoric acid salt compound in which at least two phosphoric acid groups are continuously bonded. For example, the polyphosphoric acid may be tripolyphosphoric acid ($H_5P_3O_{10}$) and/or tetrapolyphosphoric acid ($H_6P_4O_{13}$). As used herein the term "and/or" includes any and all combinations of one or more of the associated listed items.

In the metal-containing film etchant composition according to some embodiments, the phosphoric acid-based compound may adjust a pH value of the metal-containing film etchant composition. Also, the phosphoric acid-based compound may increase a dissolution rate of the TiN film to be etched and adjust an etch selectivity. The phosphoric acid-based compound may be contained at a content of about 60% by weight to about 85% by weight based on a total weight of the metal-containing film etchant composition. When the phosphoric acid-based compound is included at a content of less than about 60% by weight in the metal-containing film etchant composition, the etch rate of the TiN film may be reduced. When the content of the phosphoric acid-based compound exceeds about 85% by weight, it may be difficult to dissolve the heterocyclic organic amine compound included in the metal-containing film etchant composition.

In example embodiments, phosphoric acid having a purity of about 85% may be included as the phosphoric acid-based compound in the metal-containing film etchant composition. In this case, phosphoric acid having the purity of about 85% may be included at a content of about 70% by weight to about 99% by weight in the metal-containing film etchant composition based on a total weight of the metal-containing film etchant composition. When phosphoric acid having the purity of about 85% is included at a content of less than about 70% by weight in the metal-containing film etchant composition, the etch rate of the TiN film may be reduced. When the content of phosphoric acid having the purity of about 85% exceeds about 99% by weight, it may be difficult to dissolve the heterocyclic organic amine compound included in the metal-containing film etchant composition.

The heterocyclic organic amine compound included in the metal-containing film etchant composition according to some embodiments may contain at least one nitrogen atom in a ring. For example, the heterocyclic organic amine compound may include piperazine, piperazine derivatives, piperidine, piperidine derivatives, morpholine, morpholine derivatives, pyrazine, pyrazine derivatives, or a combination thereof.

In example embodiments, the heterocyclic organic amine compound included in the metal-containing film etchant composition according to some embodiments may be a six-membered heterocyclic organic tertiary amine compound containing two heteroatoms in a ring. The two heteroatoms in the ring may include at least one nitrogen atom. In this case, the heterocyclic organic amine compound may include piperazine, piperazine derivatives, morpholine, morpholine derivatives, pyrazine, pyrazine derivatives, or a combination thereof.

In example embodiments, the heterocyclic organic amine compound may be a compound of Formula I:

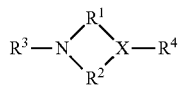

[Formula I]

wherein $R^1$ and $R^2$ may be independently be $-(CH_2)_2-$ or $-(CR'H)_2-$, and R' may be a hydrogen atom or C1-C2 alkyl group, $R^3$ and $R^4$ may be independently a hydrogen atom, C1-C4 alkyl group, C1-C4 hydroxyalkyl group, or C1-C4 aminoalkyl group, and at least one of $R^3$ and $R^4$ may be omitted, X may be a nitrogen atom (N), oxygen atom (O), or carbon atom (C) and may form a six-membered heterocyclic organic amine compound together with $R^1$ and $R^2$.

In example embodiments, the heterocyclic organic amine compound may contain two heteroatoms in a ring. In Formula I, X may be N or O.

Examples of the heterocyclic organic amine compound, which is represented by Formula I and contains two heteroatoms in the ring, may include piperazine, morpholine, 4-(2-hydroxyethyl)morpholine, 1-(2-hydroxyethyl)piperazine, 1-(2-aminoethyl)piperazine, and the like, but are not limited thereto.

In the metal-containing film etchant composition according to some embodiments, the heterocyclic organic amine compound may inhibit the etching of the W film and adjust an etch selectivity. In the metal-containing film etchant composition according to some embodiments, the heterocyclic organic amine compound may be included at a content of about 0.01% by weight to about 10% by weight based on a total weight of the metal-containing film etchant composition. When the heterocyclic organic amine compound is included at a content of less than about 0.01% by weight in the metal-containing film etchant composition, it may be difficult to adjust the etch rate of the W film. When the content of the heterocyclic organic amine compound exceeds about 10% by weight, the heterocyclic organic amine compound may not be dissolved.

The metal-containing film etchant composition according to some embodiments may further include a remaining amount of water such that the total weight of the metal-containing film etchant composition is 100% by weight. The water may be deionized water (DIW). As used herein, a term "remaining amount" may be a variable amount depending on the content of each of hydrogen peroxide, the phosphoric acid-based compound, and the heterocyclic organic amine compound included in the metal-containing film etchant composition. For example, the content of water in the metal-containing film etchant composition may refer to the remaining amount except for the content of each of hydrogen peroxide, the phosphoric acid-based compound, and the heterocyclic organic amine compound included in the metal-containing film etchant composition.

In example embodiments, the metal-containing film etchant composition according to some embodiments may further include additives, such as an etching enhancer, a surfactant, an antifoaming agent, and the like within such ranges as not to inhibit a function of each of hydrogen peroxide, the phosphoric acid-based compound, and the heterocyclic organic amine compound that are included in the metal-containing film etchant composition.

In example embodiments, the metal-containing film etchant composition according to some embodiments may not include sulfuric acid. The metal-containing film etchant composition according to some embodiments may be devoid of sulfuric acid. Accordingly, when a resultant structure in which a film to be etched, which is formed on the substrate, is etched using the metal-containing film etchant composition according to some embodiments, is rinsed and dried, even if a mixture of water with isopropyl alcohol (IPA) is used, sulfuric acid may not remain in or around the resultant structure obtained by etching the film to be etched. Thus, an exothermal reaction caused by an undesired reaction between sulfuric acid and IPA may be reduced or prevented during rinse and dry processes using IPA. As a result, process failures or damage to structures remaining on the substrate, which are caused by the exothermal reaction, may be reduced or prevented. Therefore, after the film to be etched, which is formed on the substrate, is etched using the metal-containing film etchant composition according to some embodiments, when the resultant structure is rinsed and dried, an amount of water used may be reduced, and a used amount of IPA having a relatively low surface tension may be increased.

For example, when the amount of water used in the rinse process is increased, the leaning of patterns having a relatively high aspect ratio, which remain on the substrate, may occur. In particular, when an amount of water used in a rinse process is increased, the leaning of interconnection patterns having a relatively high aspect ratio may occur during a process of forming an interconnection structure. As a result, undesired short circuits may occur between adjacent interconnection patterns or a resistance of the interconnection structure may be increased to degrade the performance of an integrated circuit (IC) device. However, since the metal-containing film etchant composition according to some embodiments does not include sulfuric acid, after an etching process using the metal-containing film etchant composition, an amount of water used in the rinse and dry processes may be reduced and minimized, and a used amount of IPA having a relatively low surface tension may be increased. Accordingly, the leaning of the interconnection patterns may be reduced or inhibited during the process of forming the interconnection structure. As a result, the occurrence of undesired short circuits between the interconnection patterns or the deterioration of the IC device due to an increase in the resistance of the interconnection structure may be reduced or prevented.

In addition, the metal-containing film etchant composition according to some embodiments may reduce or prevent the etching of an insulating film, which is exposed to the metal-containing film etchant composition together with the TiN film and the W film on the substrate. Accordingly, the TiN film and the W film may be selectively etched while reducing or preventing the etching of the insulating film simultaneously exposed to the metal-containing film etchant composition.

Hereinafter, methods of manufacturing an IC device according to some embodiments will be described in detail.

FIGS. 1A to 1E are cross-sectional views illustrating a method of manufacturing an IC device according to some embodiments.

Referring to FIG. 1A, a lower structure 120 may be formed on a substrate 110, and an insulating film 124 including a hole 124H may be formed on the lower structure 120.

The substrate 110 may include a semiconductor, such as silicon (Si) and germanium (Ge), or a compound semiconductor, such as silicon germanium (SiGe), silicon carbide (SiC), gallium arsenide (GaAs), indium arsenide (InAs), or indium phosphide (InP). The substrate 110 may include a conductive region (not shown). The conductive region may include, for example, a doped well, a doped structure, or a conductive layer. The lower structure 120 may include an insulating film, which includes, for example, a silicon oxide film, a silicon nitride film, or a combination thereof. In some embodiments, the lower structure 120 may include various conductive regions, for example, interconnection layers, contact plugs, transistors, and insulating patterns configured to insulate the interconnection layers, the contact plugs, and transistors from each other. The insulating film 124 may include, for example, a silicon-containing insulating film. For example, the insulating film 124 may include silicon oxide, silicon nitride, silicon oxycarbide (SiOC), silicon oxynitride (SiON), silicon oxycarbonitride (SiOCN), or a combination thereof.

Figure 1B:
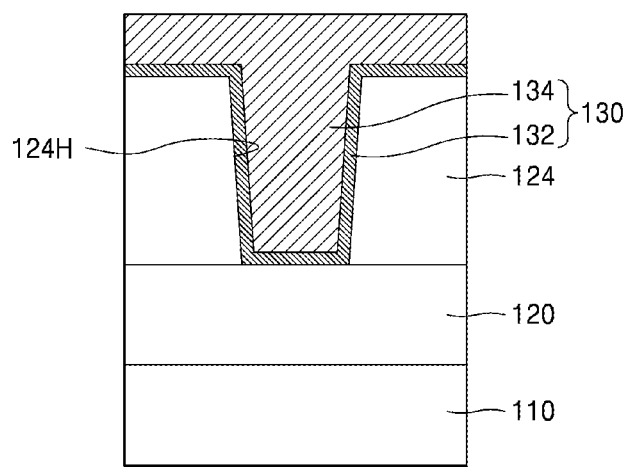

Referring to FIG. 1B, a conductive structure 130 may be formed on the resultant structure of FIG. 1A to fill the hole 124H of the insulating film 124 and cover a top surface of the insulating film 124. The conductive structure 130 may include a metal nitride film 132 and a metal film 134. The metal nitride film 132 may conformally cover an inner wall of the hole 124H and the top surface of the insulating film 124. The metal film 134 may be located on the metal nitride film 132 and fill the hole 124H and cover the top surface of the insulating film 124. In example embodiments, the metal nitride film 132 may include, for example, a TiN film, and the metal film 134 may include, for example, a W film, but are not limited thereto. In some embodiments, the metal nitride film 132 may have a uniform thickness along a surface of the structure of FIG. 1A as illustrated in FIG. 1B. "An element A filling an element B" (or similar language) as used herein means that the element A is in the element B but does not necessarily mean that the element A fills the element B entirely.

Figure 1C:
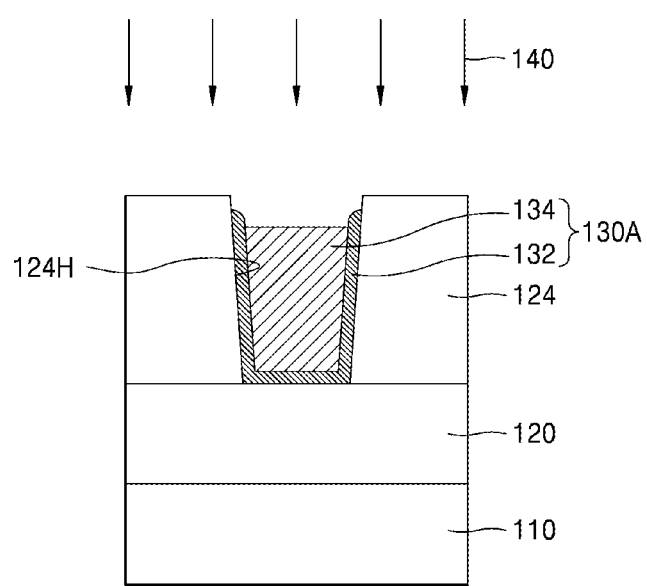

Referring to FIG. 1C, the conductive structure 130 may be anisotropically dry etched using a first etching atmosphere 140 providing a higher etch selectivity with respect to the metal film 134, from among the metal nitride film 132 and the metal film 134, thereby removing a portion of the conductive structure 130 to form a conductive pattern intermediate product 130A. The first etching atmosphere 140 may etch the metal film 134 with an etch rate greater than an etch rate of the metal nitride film 132.

The first etching atmosphere 140 may include an etch gas, which includes, for example, a fluorine-based gas, a chlorine-based gas, or a combination thereof. The fluorine-based gas may include, for example, $CF_4$, $CF_2Cl_2$, $CF_3Br$, $C_2F_6$, $C_4F_6$, $C_4F_8$, $C_5F_8$, $CHF_3$, $CH_2F_2$, or a combination thereof. The chlorine-based gas may include, for example, $Cl_2$, $CCl_4$, $BCl_3$, or a combination thereof. The first etching atmosphere 140 may further include an oxygen-containing gas. The oxygen-containing gas may include, for example, $O_2$ gas or $O_2$ plasma. In example embodiments, the first etching atmosphere 140 may include, for example, a gas mixture of $O_2$ and $CF_4$, a gas mixture of $O_2$, $CF_4$, and HBr, or a combination of the gas mixtures. In some example embodiments, the first etching atmosphere 140 may include a gas mixture including B, $BCl_3$, $Cl_2$, $CCl_4$, $BCl_3$ or a combination thereof. For example, the first etching atmosphere 140 may include a gas mixture of $Cl_2$, $O_2$, and $BCl_3$.

In the conductive pattern intermediate product 130A that remains after the conductive structure 130 is dry etched using the first etching atmosphere 140, a portion of the metal nitride film 132 may be exposed on a surface of the insulating film 124 at a higher level than a top surface of the metal film 134.

Figure 1D:
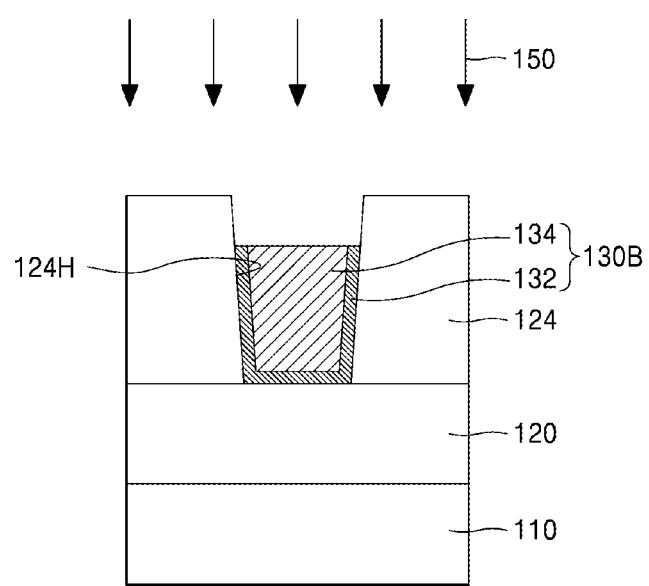

Referring to FIG. 1D, in the resultant structure of FIG. 1C, the conductive pattern intermediate product 130A may be wet etched using a second etching atmosphere 150 providing a higher etch selectivity with respect to the metal nitride film 132, from among the metal nitride film 132 and the metal film 134, which are included in the conductive pattern intermediate product 130A, thereby forming a conductive pattern 130B including a remaining portion of the metal nitride film 132 and a remaining portion of the metal film 134. A top level of the metal film 134 included in the conductive pattern 130B may be lower than a top level of the metal film 134 included in the conductive pattern intermediate product 130A of the resultant structure of FIG. 1C. The second etching atmosphere 150 may etch the metal nitride film 132 with an etch rate greater than an etch rate of the metal film 134.

The second etching atmosphere 150 may include the above-described etchant composition according to some embodiments of the inventive concept. When the conductive pattern intermediate product 130A is wet etched using the second etching atmosphere 150 containing the etchant composition, a temperature of the etchant composition may range from about 50° C. to about 80° C.

As a result of the etching of the conductive pattern intermediate product 130A in the resultant structure of FIG. 1C using the etchant composition according to some embodiments of the inventive concept, portions of the metal nitride film 132, which remain on a surface of the insulating film 124 at a higher level than the top surface of the metal film 134, may be removed, and a top level of the metal nitride film 132 may be about the same as the top level of the metal film 134. During the etching of the conductive pattern intermediate product 130A in the resultant structure of FIG. 1C by using the second etching atmosphere 150, the insulating film 124, the metal nitride film 132, and the metal film 134 may be simultaneously exposed to the etchant composition according to some embodiments of the inventive concept, which is included in the second etching atmosphere 150, and the insulating film 124 may not be substantially etched due to the etchant composition. Here, it will be understood that when the insulating film 124 is referred to as being not substantially etched, an etched amount of the insulating film 124 may be 0 (zero) or about 0.01% by volume or less of an etched amount of the metal nitride film 132 under a condition where the insulating film 124 has the same thickness as the metal nitride film 132. Accordingly, during the etching of the conductive pattern intermediate product 130A in the resultant structure of FIG. 1C using the etchant composition according to some embodiments of the inventive concept, the insulating film 124 may not be etched or consumed due to the second etching atmosphere 150 but maintain insulating characteristics without physical damage.

Figure 1E:
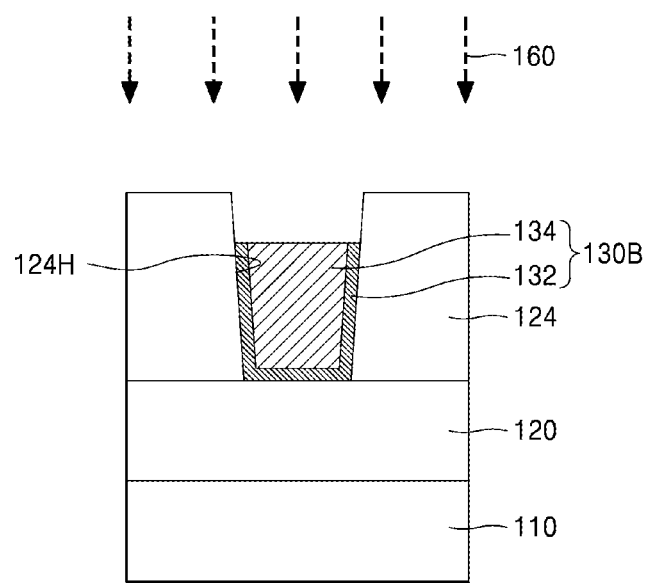

Referring to FIG. 1E, the resultant structure of FIG. 1D may be rinsed with water and then dried using IPA 160. While the resultant structure of FIG. 1D, which has been rinsed with water, is dried using IPA 160, even if residue of the etchant composition remains in and around the resultant structure of FIG. 1D, which has been rinsed with water, an exothermal reaction caused by an undesired reaction between the residue of the etchant composition and IPA 160 may be impeded or prevented. Also, process failures or damage to structures remaining on the substrate 110, which are caused by the exothermal reaction, may be reduced or prevented. Accordingly, after the metal nitride film 132 and the metal film 134, which are included in the conductive pattern intermediate product 130A over the substrate 110, are etched using the metal-containing film etchant composition according to some embodiments of the inventive concept, when the etched resultant structure is rinsed and dried, an amount of water used may be reduced, and a used amount of IPA 160 having a relatively low surface tension may be increased, and thus, a dry process may be effectively performed.

Figure 2:
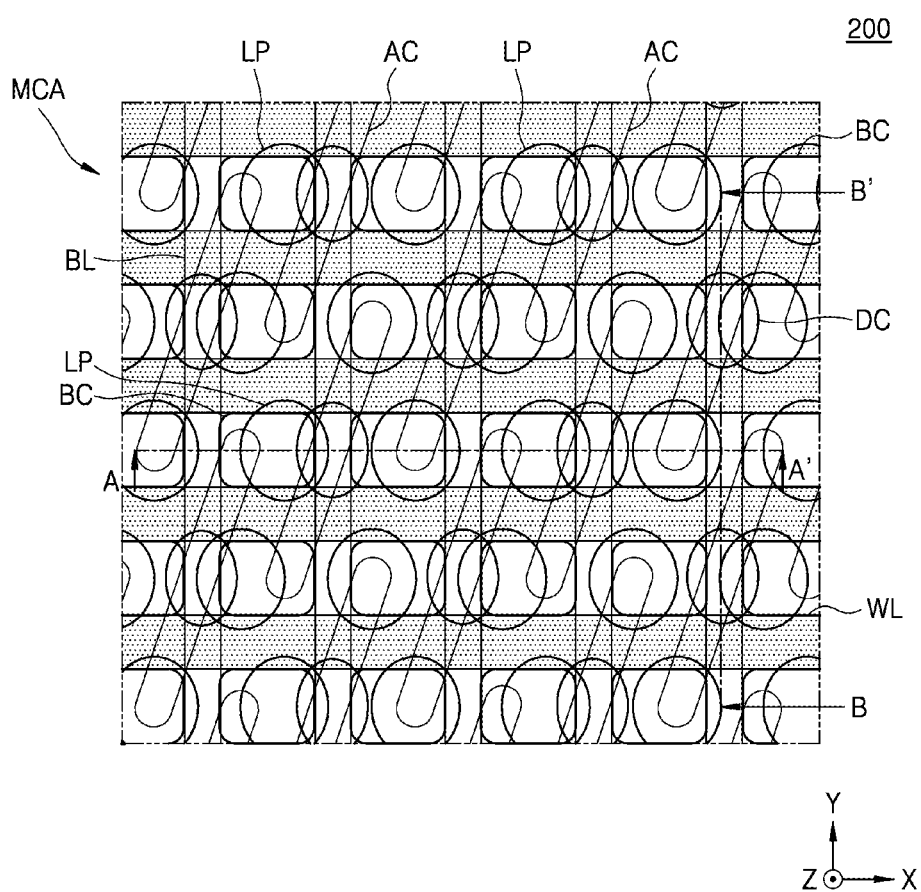
FIG. 2 is a schematic plan layout of a cell array area of an IC device, which may be obtained using a method of manufacturing an IC device according to some embodiments of the inventive concept.

FIG. 2 is a schematic plan layout of a cell array area MCA of an IC device 200, which may be obtained using a method of manufacturing an IC device according to some embodiments of the inventive concept.

Referring to FIG. 2, the cell array area MCA may include a plurality of active areas AC. Each of the plurality of active areas AC may be arranged to have a major axis in an oblique direction to an X direction and a Y direction. In some embodiments, each of the plurality of active areas AC may extend longitudinally in a direction that traverses both the X direction and the Y direction as illustrated in FIG. 2. A plurality of word lines WL may intersect with the plurality of active areas AC and extend parallel to each other in the X direction. A plurality of bit lines BL may be located on the plurality of word lines WL and extend parallel to each other in the Y direction. The plurality of bit lines BL may be connected to the plurality of active areas AC through direct contacts DC. A plurality of buried contacts BC may be formed between two adjacent ones of the plurality of bit lines BL. The plurality of buried contacts BC may be arranged in a line in the X direction and the Y direction. A plurality of conductive landing pads LP may be formed on the plurality of buried contacts BC. The plurality of buried contacts BC and the plurality of conductive landing pads LP may connect a lower electrode (not shown) of a capacitor formed on the plurality of bit lines BL to the active areas AC. The plurality of conductive landing pads LP may be arranged to partially overlap the buried contacts BC, respectively.

FIGS. 3A to 3I are cross-sectional views illustrating a method of manufacturing the IC device 200 shown in FIG. 2, according to some example embodiments of the inventive concept. A sectional configuration of a partial region taken along a line A-A' of FIG. 2 is illustrated in FIGS. 3A to 3I.

Figure 3A:
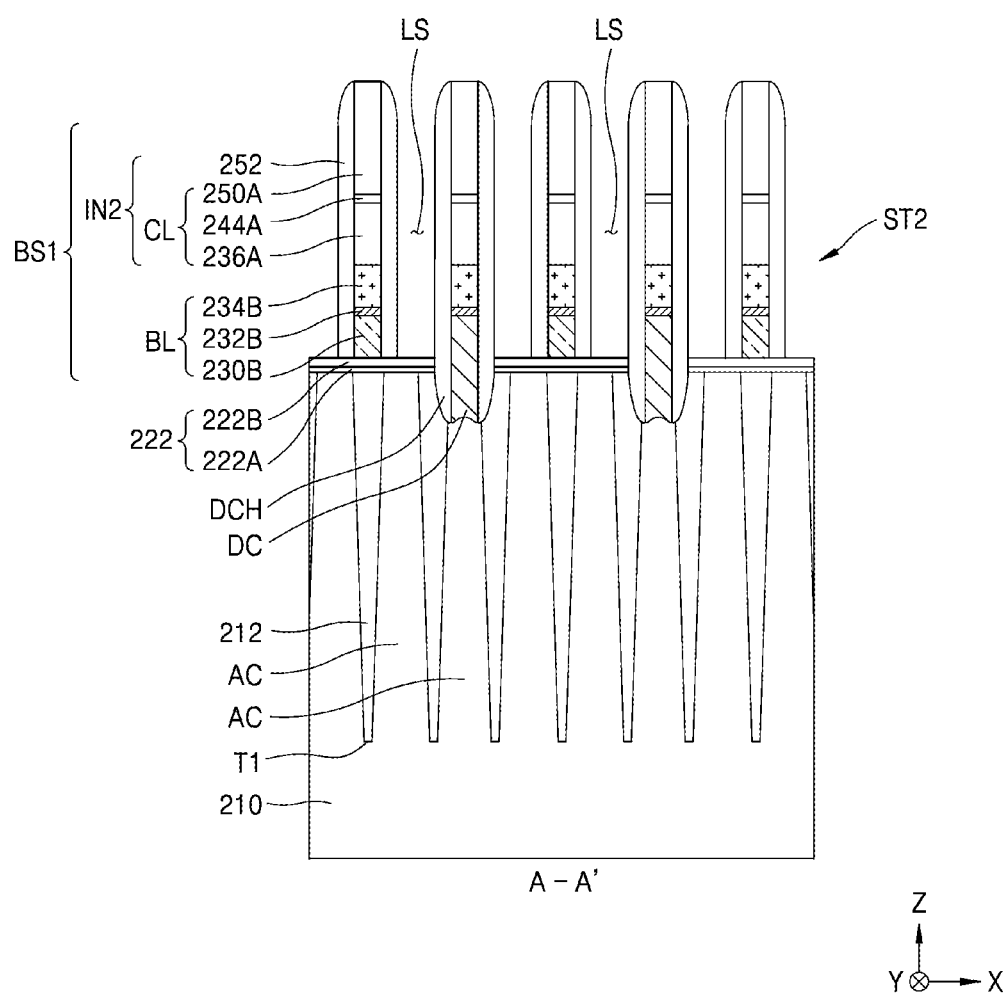
FIGS. 3A to 3I are cross-sectional views illustrating a method of manufacturing the IC device shown in FIG. 2, according to some embodiments of the inventive concept.

Referring to FIG. 3A, a lower structure ST2 may be formed on a substrate 210.

A device isolation trench T1 may be formed in the substrate 210, and a device isolation film 212 may be formed within the device isolation trench T1. A plurality of active areas AC may be defined by the device isolation film 212 in the substrate 210. The substrate 210 may include silicon, for example, single crystalline silicon, polysilicon, or amorphous silicon. The substrate 210 may include a doped well. The device isolation film 212 may include, for example, an oxide film, a nitride film, or a combination thereof.

The lower structure ST2 may include a buffer film 222 formed on the substrate 210 and a plurality of bit line structures BS1 formed on the buffer film 222. The plurality of bit line structures BS1 may include a plurality of bit lines BL, a plurality of insulating capping lines CL covering the plurality of bit lines BL, and a plurality of insulating spacers 252 covering sidewalls of the plurality of bit lines BL and the plurality of insulating capping lines CL. The plurality of insulating capping lines CL and the plurality of insulating spacers 252 may constitute a plurality of insulating structures IN2.

The buffer film 222 may include a first insulating film 222A and a second insulating film 222B. Each of the first insulating film 222A and the second insulating film 222B may include, for example, an oxide film, a nitride film, or a combination thereof. A plurality of direct contacts DC may be formed within a plurality of direct contact holes DCH in the substrate 210. The plurality of direct contacts DC may be connected to the plurality of active areas AC. The plurality of direct contacts DC may include, for example, silicon (Si), germanium (Ge), tungsten (W), tungsten nitride (WN), cobalt (Co), nickel (Ni), aluminum (Al), molybdenum (Mo), ruthenium (Ru), titanium (Ti), titanium (TiN), tantalum (Ta), tantalum nitride (TaN), copper (Cu), or a combination thereof.

The plurality of bit lines BL may extend longitudinally in the Y direction over the plurality of direct contact DC. Each of the plurality of bit lines BL may be connected to the active area AC through the direct contact DC. Each of the plurality of bit lines BL may include a lower conductive pattern 230B, a middle conductive pattern 232B, and an upper conductive pattern 234B, which are sequentially stacked on the substrate 210. The lower conductive pattern 230B may include, for example, doped polysilicon, the middle conductive pattern 232B may include, for example, TiN, TiSiN, or a combination thereof, and the upper conductive pattern 234B may include, for example, W.

The plurality of insulating capping lines CL may include a lower insulating capping pattern 236A, an insulating thin film pattern 244A, and an upper insulating capping pattern 250A. Each of the lower insulating capping pattern 236A, the insulating thin film pattern 244A, and the upper insulating capping pattern 250A may include, for example, a silicon nitride film. The plurality of insulating spacers 252 may extend long in parallel to the plurality of bit lines BL in the Y direction. The plurality of insulating spacers 252 may include, for example, a silicon oxide film, a silicon nitride film, or a combination thereof. The plurality of insulating spacers 252 may fill the direct contact holes DCH around the direct contacts DC. A line space LS may respectively remain between the plurality of bit lines BL that are covered by the plurality of insulating spacers 252.

Figure 3B:
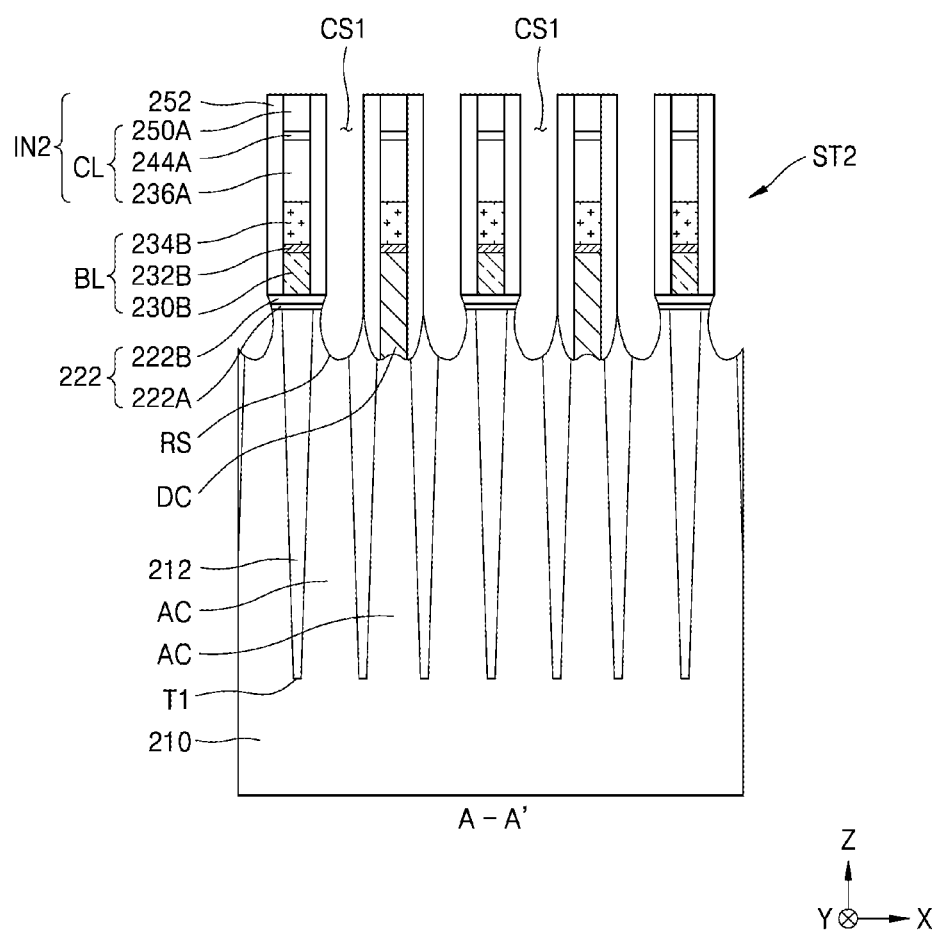

Referring to FIG. 3B, a plurality of insulating fences (not shown) may be respectively formed between the plurality of bit lines BL, and thus, the line space LS may be separated into a plurality of contact spaces CS1. The upper insulating capping pattern 250A and the insulating spacers 252 may be exposed to an etching atmosphere during the formation of the plurality of insulating fences, and thus, heights of the upper insulating capping pattern 250A and the insulating spacers 252 may be reduced. Thereafter, portions of structures exposed through the plurality of contact spaces CS1 may be removed, and thus a plurality of recess spaces RS may be formed to expose the active areas AC of the substrate 210 between the respective bit lines BL. The plurality of insulating fences may include, for example, a silicon nitride film.

Figure 3C:
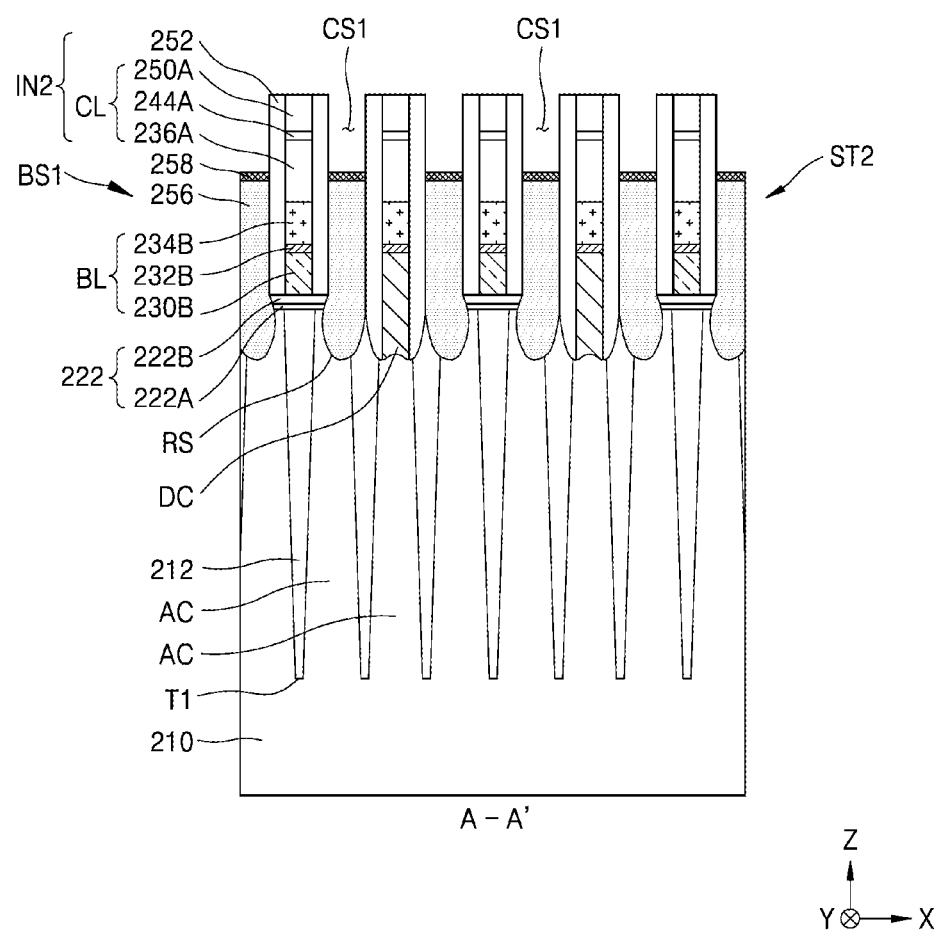

Referring to FIG. 3C, a plurality of conductive plugs 256 may be formed to fill the plurality of recess spaces RS between the plurality of bit lines BL, respectively, and partially fill the contact spaces CS1 between the plurality of bit lines BL, respectively. A metal silicide film 258 may be formed to cover top surfaces of the conductive plugs 256. The conductive plugs 256 may include, for example, doped polysilicon. The metal silicide film 258 may include, for example, cobalt silicide, nickel silicide, or manganese silicide.

Figure 3D:
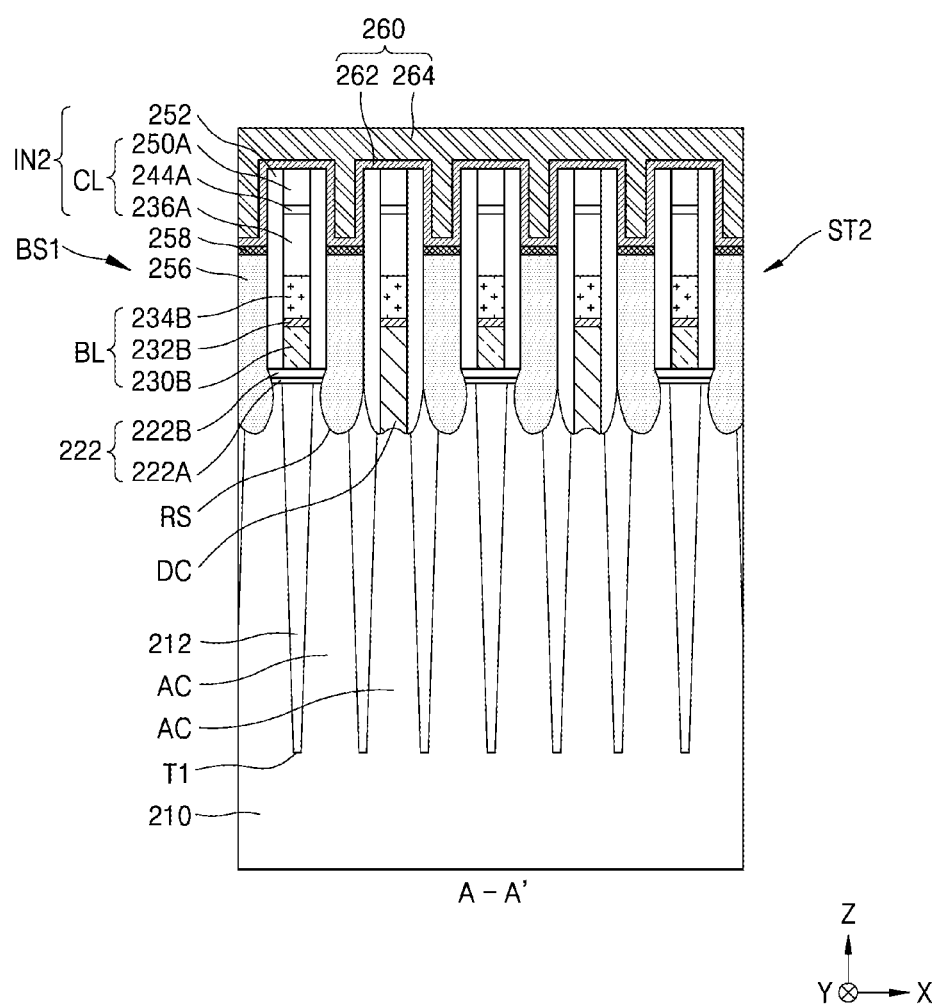

Referring to FIG. 3D, a conductive structure 260 may be formed to cover exposed surfaces of the resultant structure of FIG. 3C. The conductive structure 260 may include a metal nitride film 262 and a metal film 264. The metal nitride film 262 may include, for example, a TiN film, and the metal film 264 may include, for example, a W film.

Figure 3E:
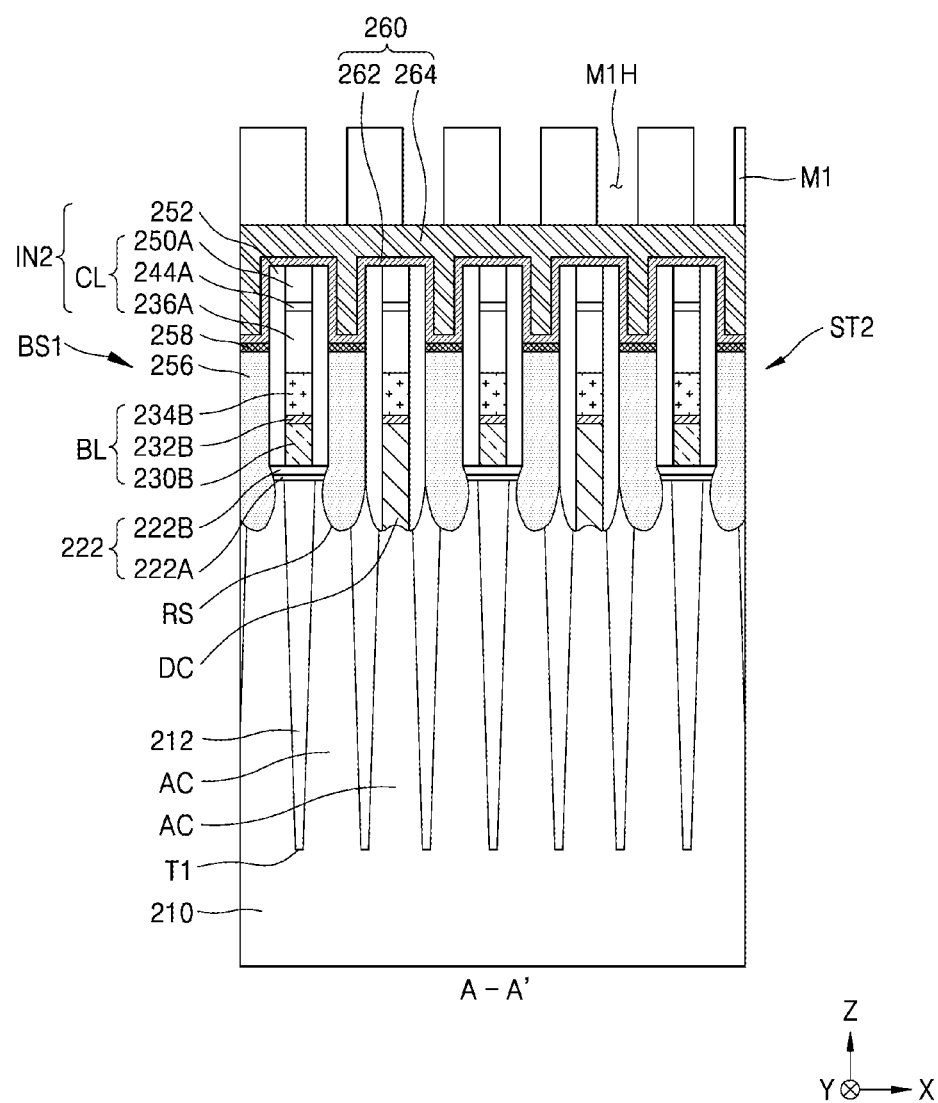

Referring to FIG. 3E, a mask pattern M1 may be formed on the resultant structure of FIG. 3D. The mask pattern M1 may have holes M1H exposing a top surface of the conductive structure 260. The mask pattern M1 may include a plurality of hard mask layers including different materials and a photoresist pattern covering the plurality of hard mask layers. For example, the plurality of hard mask layers may include, but are not limited to, an amorphous carbon layer (ACL), a polysilicon layer, a silicon oxide film, a silicon nitride film, a silicon oxynitride film, or a combination thereof.

Figure 3F:
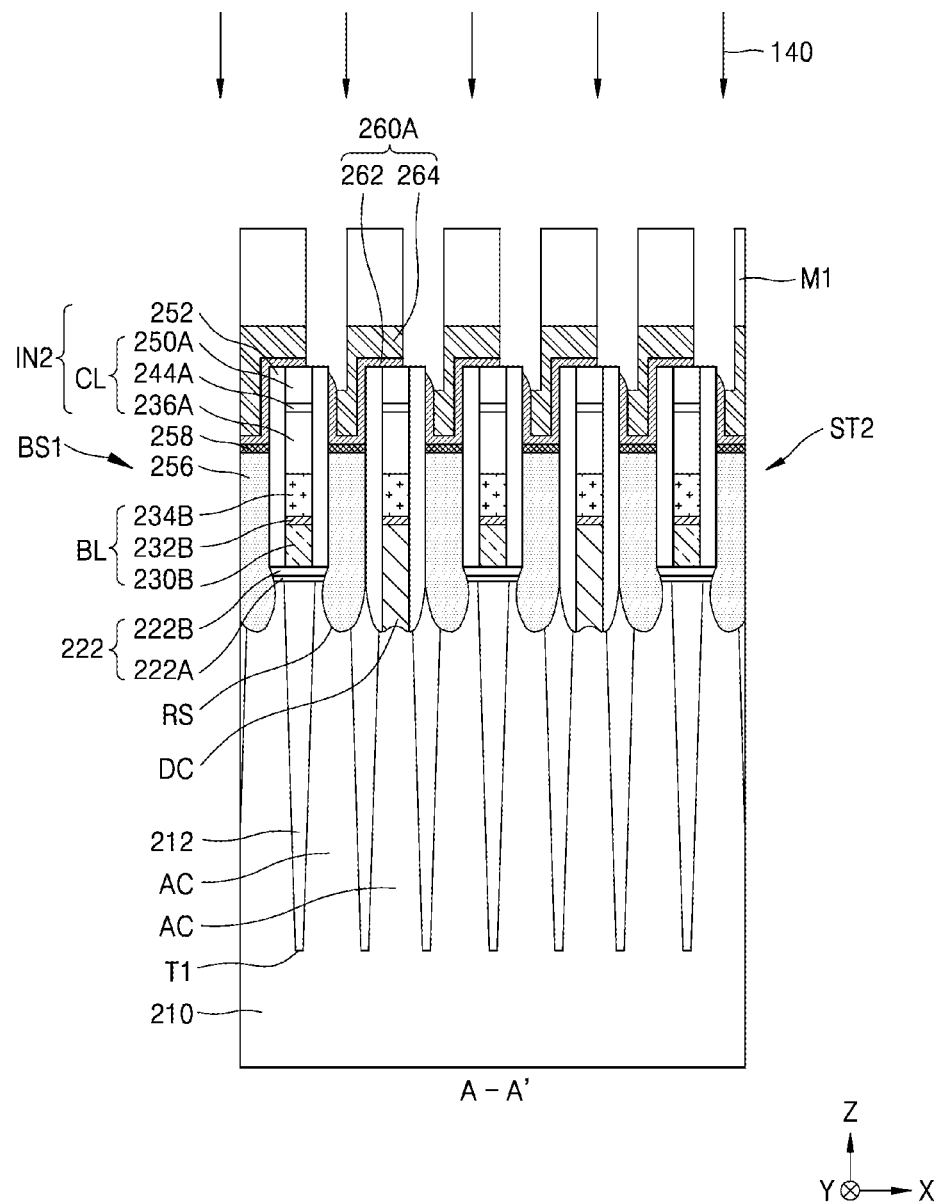

Referring to FIG. 3F, the conductive structure 260 may be anisotropically etched using the mask pattern M1 as an etch mask. The anisotropic etching of the conductive structure 260 may be performed using a first etching atmosphere 140 providing a higher etch selectivity with respect to the metal film 264, out of the metal nitride film 262 and the metal film 264. As a result of the anisotropic etching of the conductive structure 260, a portion of the conductive structure 260 may be removed to form a conductive pattern intermediate product 260A. The first etching atmosphere 140 may be the same as described with reference to FIG. 1C. In the conductive pattern intermediate product 260A, a portion of the metal nitride film 262 may be exposed through the mask pattern M1.

Figure 3G:
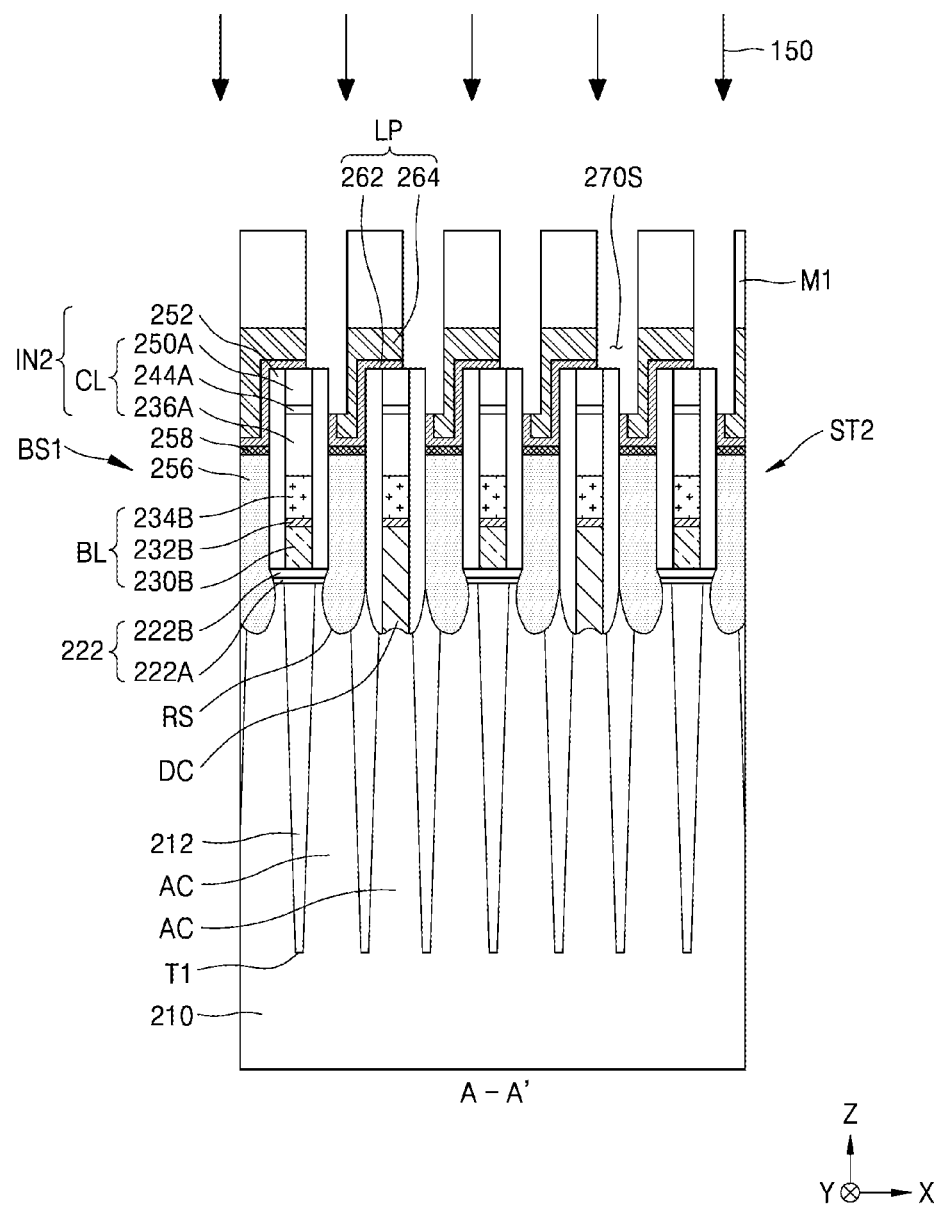

Referring to FIG. 3G, in the resultant structure of FIG. 3F, the conductive pattern intermediate product 260A may be wet etched using a second etching atmosphere 150 providing a higher etch selectivity respect to the metal nitride film 262, from among the metal nitride film 262 and the metal film 264, which are included in the conductive pattern intermediate product 260A, thereby forming a plurality of conductive landing pads LP including a remaining portion of the metal nitride film 262 and a remaining portion of the metal film 264.

The second etching atmosphere 150 may include the above-described etchant composition according to some embodiments of the inventive concept. When the conductive pattern intermediate product 260A is wet etched using the etchant composition included in the second etching atmosphere 150, a temperature of the etchant composition may range from about 50° C. to about 80° C.

As a result of the etching of the conductive pattern intermediate product 260A in the resultant structure of FIG. 3F using the etchant composition according to some embodiments of the inventive concept, portions of the metal nitride film 262, which have been exposed by the holes M1H of the mask pattern M1, may be removed, and the plurality of insulating structures IN2 may be exposed through the mask pattern M1. The plurality of conductive landing pads LP may have a plurality of island pattern shapes, which are spaced apart from each other, in a view from above as shown in FIG. 2. The plurality of conductive landing pads LP may be formed to vertically overlap portions of the plurality of bit lines BL. Each of the plurality of conductive landing pads LP may be connected to one selected out of the conductive plugs 256 through the metal silicide film 258. After the plurality of conductive landing pads LP are formed, insulating spaces 270S exposing the plurality of insulating structures IN2 may be formed around the plurality of conductive landing pads LP.

During the etching of the conductive pattern intermediate product 260A in the resultant structure of FIG. 3F by using the etchant composition according to some embodiments of the inventive concept, the plurality of insulating structures IN2, the metal nitride film 262, and the metal film 264 may be simultaneously exposed to the etchant composition, which is included in the second etching atmosphere 150, and the plurality of insulating structures IN2 may not be substantially etched due to the etchant composition. Here, it will be understood that when the plurality of insulating structures IN2 are referred to as being not substantially etched, an etched amount of each of the plurality of insulating structures IN2 may be 0 or about 0.01% by volume or less of an etched amount of the metal nitride film 262 under a condition where the plurality of insulating structures IN2 have the same thickness as the metal nitride film 262. Accordingly, during the etching of the conductive pattern intermediate product 260A in the resultant structure of FIG. 3F using the etchant composition according to some embodiments of the inventive concept, the plurality of insulating structures IN2 may not be etched or consumed due to the second etching atmosphere 150 but maintain insulating characteristics without physical damage.

Figure 3H:
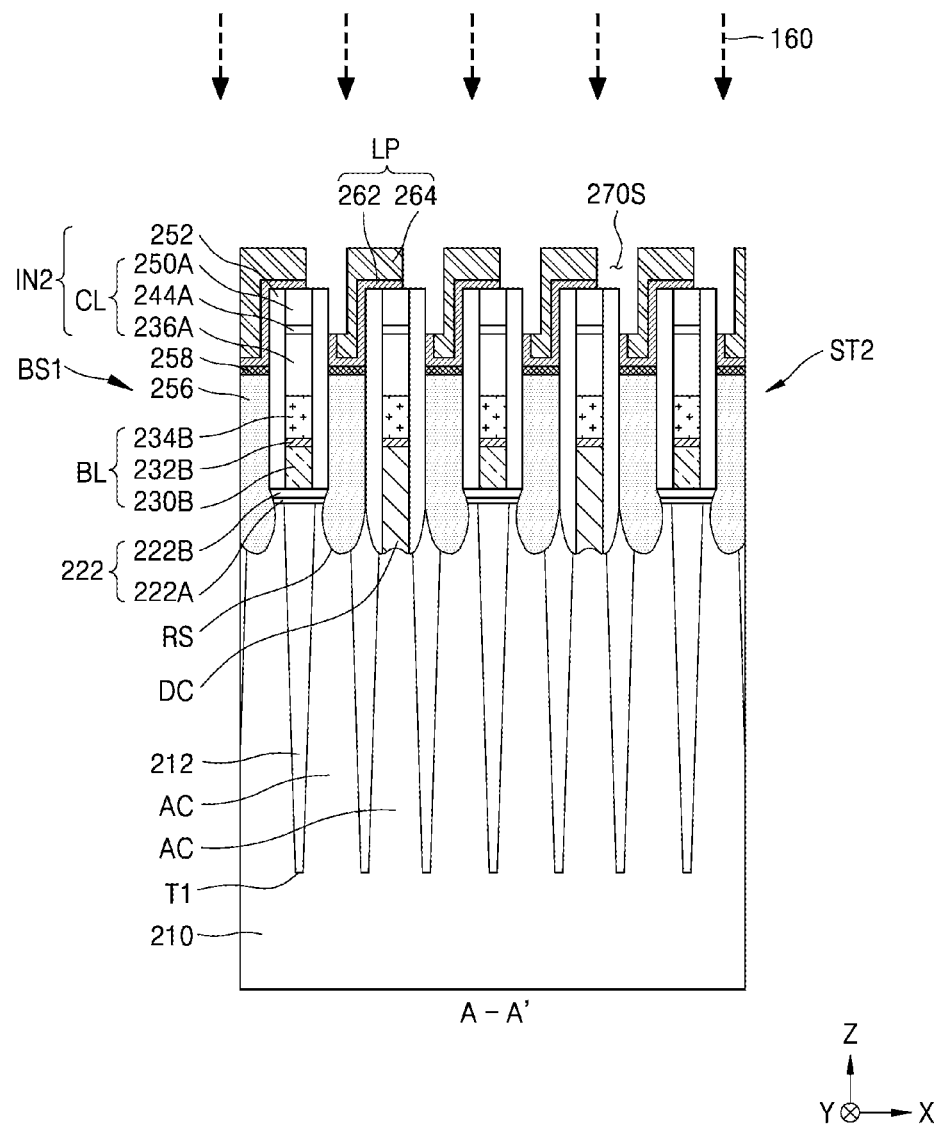

Referring to FIG. 3H, after top surfaces of the plurality of conductive landing pads LP are exposed by removing the mask pattern M1 from the resultant structure of FIG. 3G, the resultant structure may be rinsed with water and then dried using IPA 160. While the resultant structure of FIG. 3G, which has been rinsed with water, is dried using IPA 160, even if residue of the etchant composition remains in and around the resultant structure of FIG. 3G, which has been rinsed with water, an exothermal reaction caused by an undesired reaction between the residue of the etchant composition and IPA 160 may be impeded or prevented. Also, process failures or damage to structures remaining on the structure 210, which are caused by the exothermal reaction, may be reduced or prevented. Accordingly, as described above with reference to FIG. 3G, after the metal nitride film 262 and the metal film 264, which are included in the conductive pattern intermediate product 260A, are etched using the second etching atmosphere 150, when the etched resultant structure is rinsed and dried, an amount of water used may be reduced, and a used amount of IPA 160 having a relatively low surface tension may be increased, and thus, a dry process may be effectively performed.

Furthermore, since the metal-containing film etchant composition according to some embodiments does not include sulfuric acid, after an etching process using the metal-containing film etchant composition, an amount of water used in the rinse and dry processes may be reduced or minimized, and a used amount of IPA having a relatively low surface tension may be increased. Accordingly, even if the plurality of conductive landing pads LP obtained by etching the metal nitride film 262 and metal film 264 have a relatively high aspect ratio, the leaning of the plurality of conductive landing pads LP may be reduced or inhibited. As a result, the occurrence of undesired short circuits between the plurality of conductive landing pads LP or the deterioration of the IC device 200 due to an increase in the resistance of the plurality of conductive landing pads LP may be reduced or prevented.

Figure 3I:
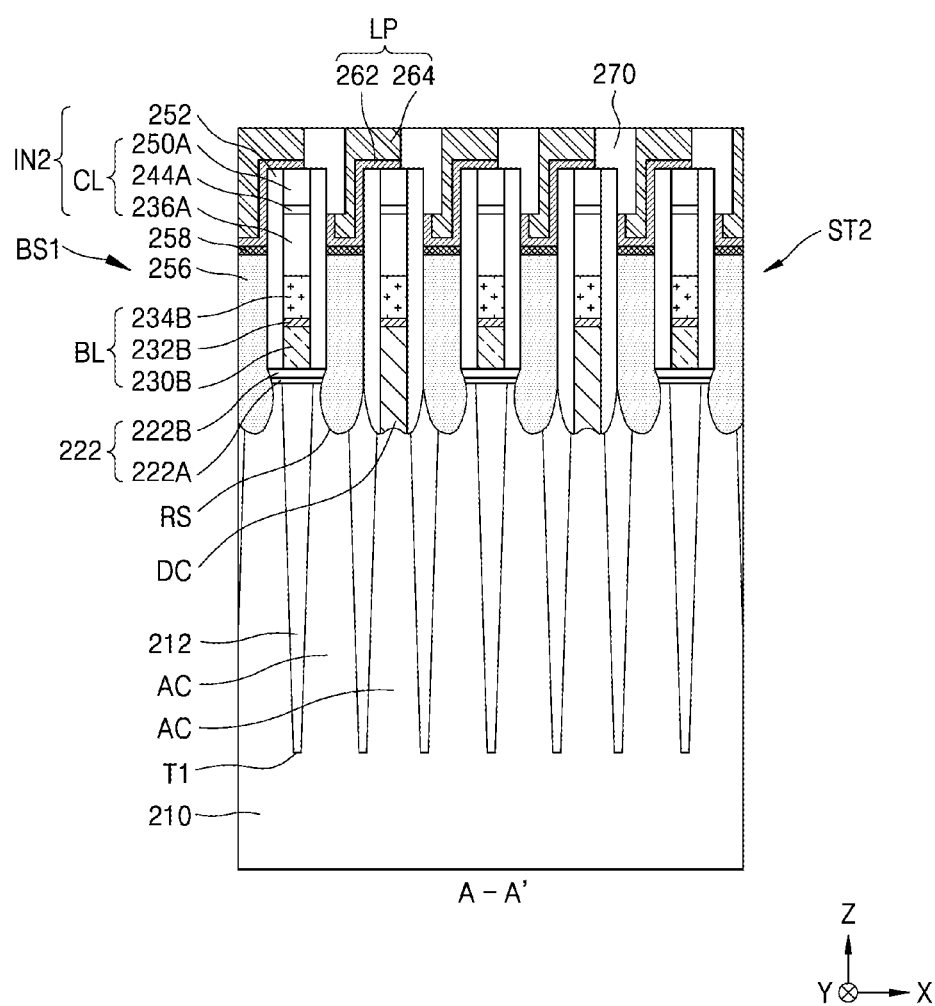

Referring to FIG. 3I, an insulating film 270 may be formed to fill the insulating spaces 270S in the resultant structure of FIG. 3H. The insulating film 270 may include, for example, a silicon oxide film.

In example embodiments, before the insulating spaces 270S are filled with the insulating film 270, portions of the plurality of insulating spacers 252 may be modified using the insulating spaces 270S to form air spacers in the plurality of insulating spacers 252. After the insulating film 270 is formed, a capacitor lower electrode may be formed on the plurality of conductive landing pads LP.

FIGS. 4A to 4G are cross-sectional views illustrating a method of manufacturing the IC device 200 shown in FIG. 2, according to an example embodiment. A sectional configuration of a partial region taken along a line B-B' of FIG. 2 is illustrated in FIGS. 4A to 4G. Processes of forming the plurality of word lines WL shown in FIG. 2, according to example embodiments, will be described with reference to FIGS. 4A to 4G. In FIGS. 4A to 4G, the same reference numerals are used to denote the same elements as in FIGS. 3A to 3I, and a detailed description thereof may be omitted.

Figure 4A:
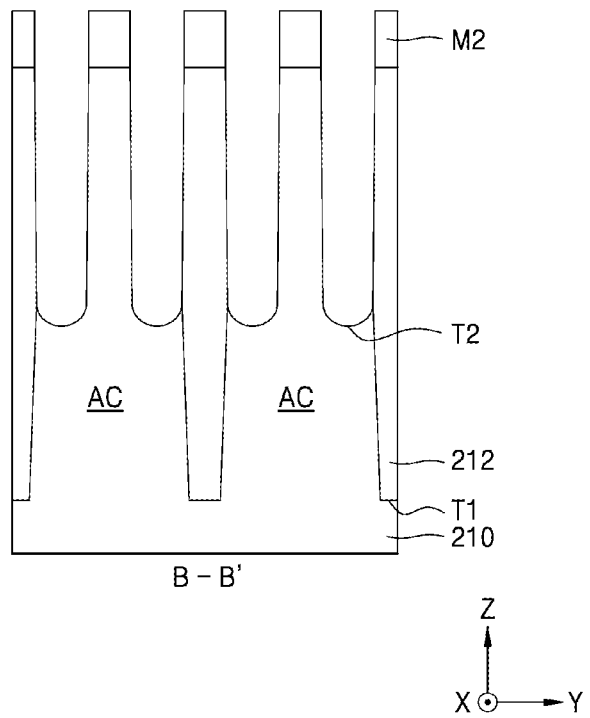
FIGS. 4A to 4G are cross-sectional views illustrating a method of manufacturing the IC device shown in FIG. 2, according to some embodiments of the inventive concept.

Referring to FIG. 4A, a plurality of device isolation trenches T1 and a plurality of device isolation films 212 may be formed in a substrate 210 to define a plurality of active areas AC in the substrate 210. Thereafter, a plurality of mask patterns M2 that may be apart from each other may be formed on the plurality of active areas AC and the device isolation films 212, and the plurality of mask patterns M2 may extend parallel to each other in an X direction. The plurality of mask patterns M2 may include, for example, a hard mask pattern including a single film or a multilayered structure. For example, the plurality of mask patterns M2 may include an oxide film, a nitride film, or a combination thereof, but are not limited thereto. The plurality of active areas AC and the device isolation films 212 may be etched using the plurality of mask patterns M2 as an etch mask to form a plurality of word line trenches T2, which extend parallel to each other in the X direction.

Figure 4B:
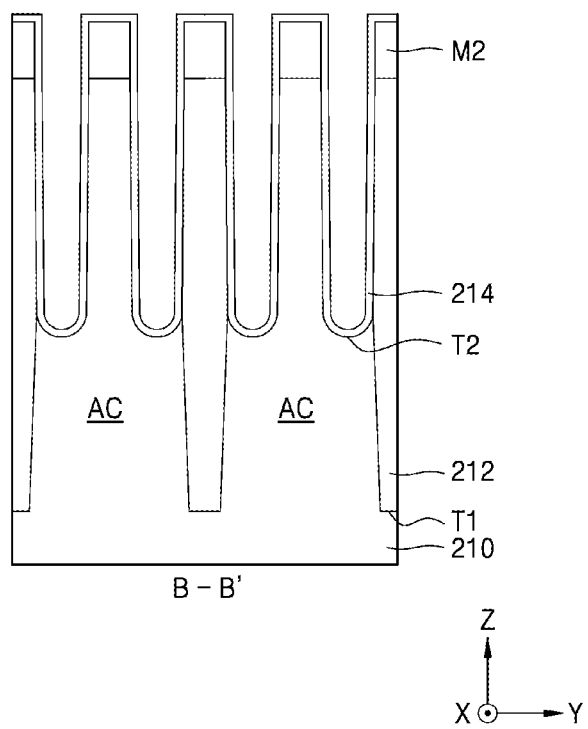

Referring to FIG. 4B, a gate dielectric film 214 may be formed to cover an inner surface of each of the plurality of word line trenches T2. The gate dielectric film 214 may cover the inner surfaces of the word line trenches T2 to be in contact with the plurality of active areas AC and the device isolation films 212. The gate dielectric film 214 may include, for example, a silicon oxide film, a silicon nitride film, a silicon oxynitride film, an oxide/nitride/oxide (ONO) film, or a high-k dielectric film having a higher dielectric constant than the silicon oxide film. The high-k dielectric film may have a dielectric constant of about 10 to about 25. For example, the high-k dielectric film may include, for example, $HfO_2$, $Al_2O_3$, $HfAlO_3$, $Ta_2O_3$, or $TiO_2$. The gate dielectric film 214 may be formed, for example, using a thermal oxidation process, an atomic layer deposition (ALD) process, or a combination thereof.

Figure 4C:
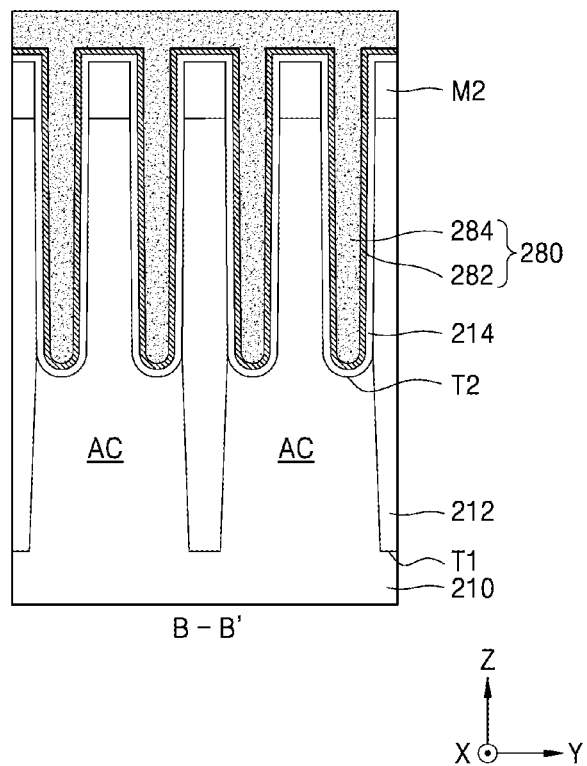

Referring to FIG. 4C, a conductive structure 280 may be formed on the resultant structure of FIG. 4B to fill the plurality of word line trenches T2. The conductive structure 280 may include a metal nitride film 282 conformally covering an inner wall of each of the plurality of word line trenches T2 and a metal film 284 filling each of the plurality of word line trenches T2 on the metal nitride film 282. The metal nitride film 282 may include, for example, a TiN film, and the metal film 284 may include, for example, a W film.

Figure 4D:
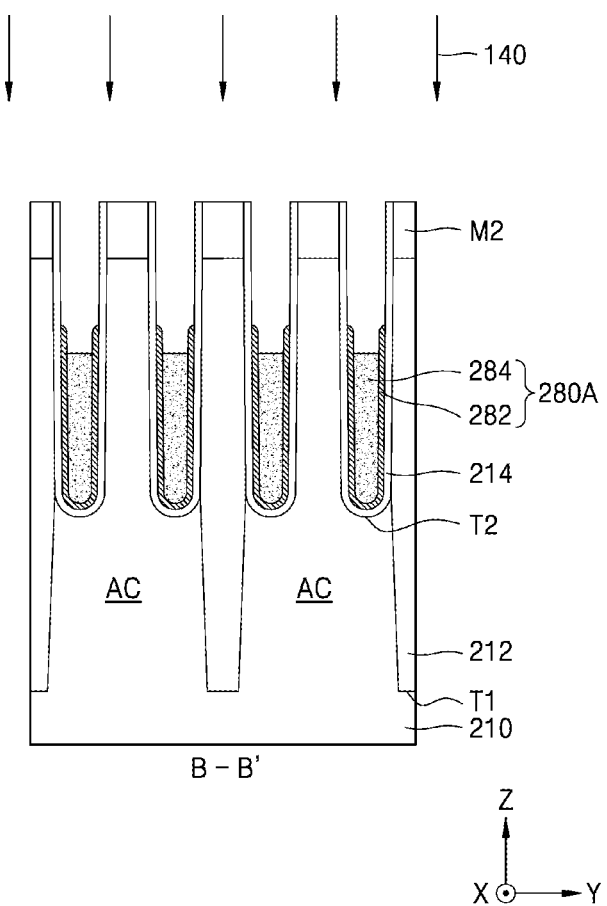

Referring to FIG. 4D, the conductive structure 280 may be anisotropically etched in the resultant structure of FIG. 4C. The anisotropic etching of the conductive structure 280 may be performed using a first etching atmosphere 140 providing a higher etch selectivity with respect to the metal film 284, from among the metal nitride film 282 and the metal film 284. The first etching atmosphere 140 may be the same as described with reference to FIG. 1C. As a result of the anisotropic dry etching of the conductive structure 280 in the first etching atmosphere 140, a portion of the conductive structure 280 may be formed to form a conductive pattern intermediate product 280A.

In the conductive pattern intermediate product 280A, which remains after the conductive structure 280 is dry etched using the first etching atmosphere 140, a portion of the metal nitride film 282 may be exposed on a surface of the gate dielectric film 214 at a higher level than a top surface of the metal film 284. After the conductive pattern intermediate product 280A is formed, top surfaces of the mask patterns M2 may be exposed.

Figure 4E:
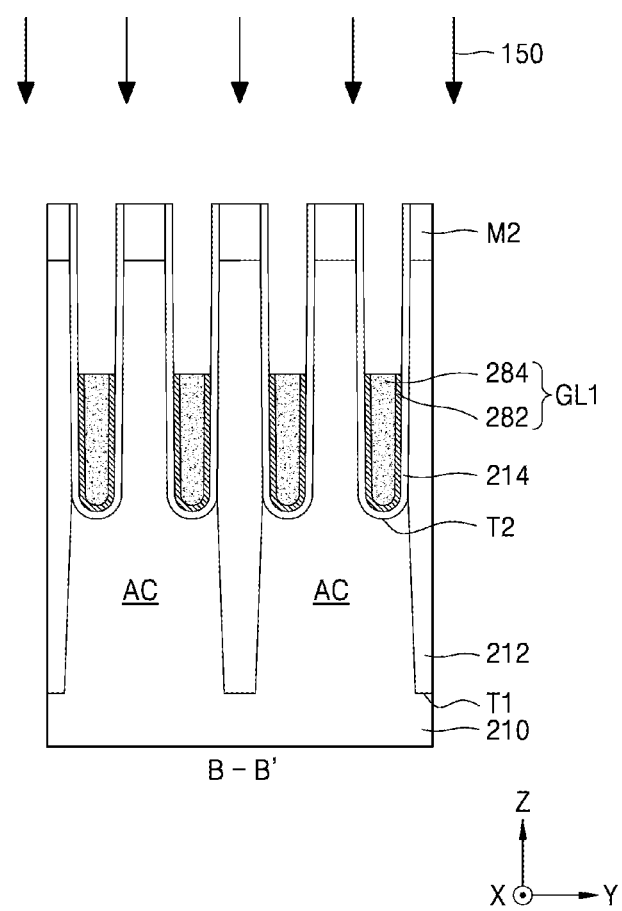

Referring to FIG. 4E, in the resultant structure of FIG. 4D, the conductive pattern intermediate product 280A may be wet etched using a second etching atmosphere 150 providing a higher etch selectivity with respect to the metal nitride film 282, from among the metal nitride film 282 and the metal film 284, which are included in the conductive pattern intermediate product 280A, thereby forming a plurality of lower gate lines GL1 including remaining portions of the metal nitride film 282 and remaining portions of the metal film 284.

The second etching atmosphere 150 may include an etchant composition according to some embodiments of the inventive concept as described above. When the conductive pattern intermediate product 280A is wet etched using the etchant composition included in the second etching atmosphere 150, a temperature of the etchant composition may range from about 50° C. to 80° C.

As a result of the etching of the conductive pattern intermediate product 280A in the resultant structure of FIG. 4D using the etchant composition according to some embodiments of the inventive concept, portions of the metal nitride film 282, which cover the surface of the gate dielectric film 214 at a higher level than the top surface of the metal film 284, may be removed, and a top level of the metal nitride film 282 may be about the same as a top level of the metal film 284. During the etching of the conductive pattern intermediate product 180A in the resultant structure of FIG. 4D by using the etchant composition according to some embodiments of the inventive concept, the gate dielectric film 214, the metal nitride film 282, and the metal film 284 may be simultaneously exposed to the etchant composition, which is included in the second etching atmosphere 150, and the gate dielectric film 214 may not be substantially etched due to the etchant composition. Here, it will be understood that when the gate dielectric film 214 is referred to as being not substantially etched, an etched amount of the gate dielectric film 214 may be 0 or about 0.01% by volume or less of an etched amount of the metal nitride film 282 under a condition where the gate electric film 214 has the same thickness as the metal nitride film 282. Accordingly, during the etching of the conductive pattern intermediate product 280A in the resultant structure of FIG. 4D using the etchant composition according to some embodiments of the inventive concept, the gate dielectric film 214 may not be etched or consumed due to the second etching atmosphere 150 but maintain insulating characteristics without physical damage.

Figure 4F:
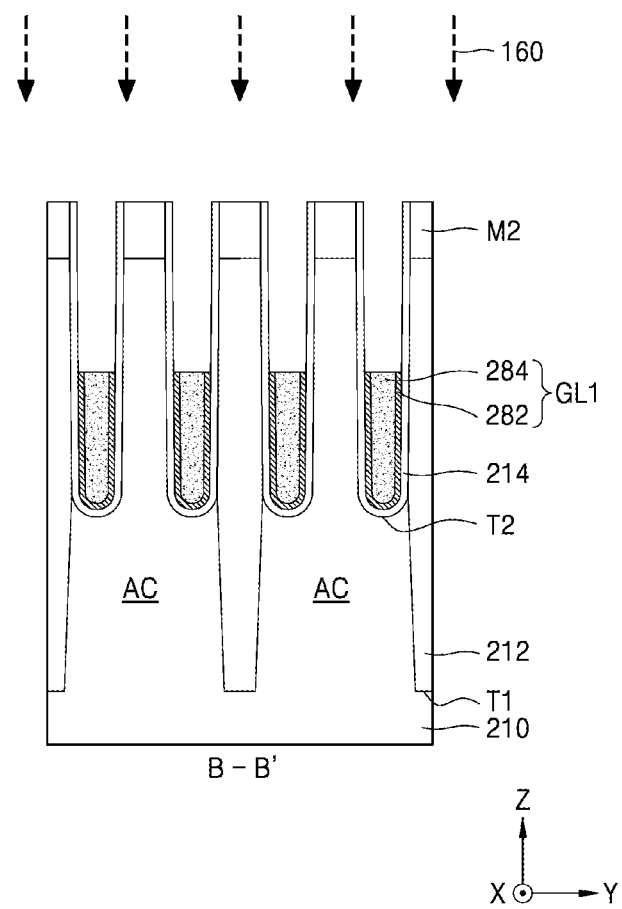

Referring to FIG. 4F, the resultant structure of FIG. 4E may be rinsed with water and then dried using IPA 160. While the resultant structure of FIG. 4E, which has been rinsed with water, is dried using IPA 160, even if residue of the etchant composition remains in and around the resultant structure of FIG. 4E, which has been rinsed with water, an exothermal reaction caused by an undesired reaction between the residue of the etchant composition and IPA 160 may be impeded or prevented. Also, process failures or damage to structures remaining on the structure 210, which are caused by the exothermal reaction, may be reduced or prevented. Accordingly, as described above with reference to FIG. 4E, after the metal nitride film 282 and the metal film 284, which are included in the conductive pattern intermediate product 280A, are etched using the second etching atmosphere 150, when the etched resultant structure is rinsed and dried, an amount of water used may be reduced, and a used amount of IPA 160 having a relatively low surface tension may be increased, and thus, a dry process may be effectively performed.

In addition, since the metal-containing film etchant composition according to some embodiments of the inventive concept does not include sulfuric acid, after an etching process using the metal-containing film etchant composition, an amount of water used in the rinse and dry processes may be reduced or minimized, and a used amount of IPA having a relatively low surface tension may be increased. Accordingly, even if the plurality of word line trenches T2 have a relatively high aspect ratio, the leaning of a portion of the substrate 210 configured to define the plurality of word line trenches T2 or the leaning of a portion of the device isolation film 212 may be reduced or inhibited.

Figure 4G:
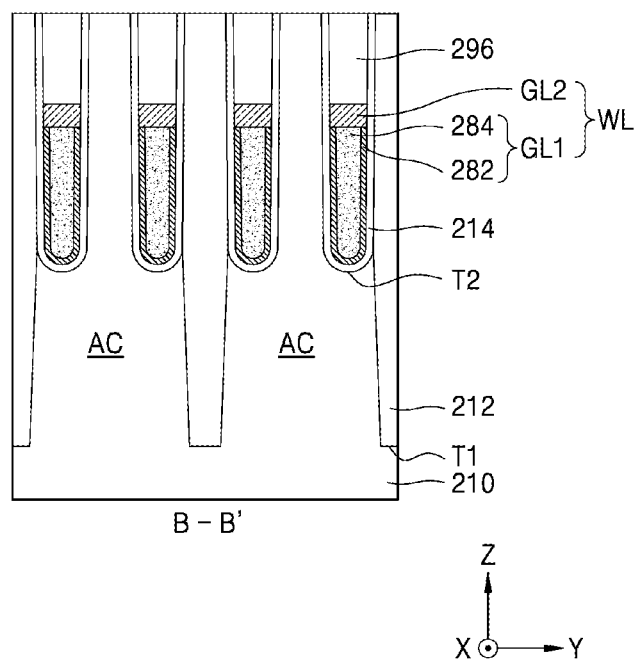

Referring to FIG. 4G, an upper gate line GL2 may be formed within each of the plurality of word line trenches T2 to cover a top surface of the lower gate line GL1. The upper gate line GL2 may include doped polysilicon. The lower gate line GL1 and the upper gate line GL2 may constitute a word line WL.

Thereafter, a space remaining on the upper gate line GL2 in an inner space of each of the plurality of word line trenches T2 may be filled with an insulating capping pattern 296. Afterwards, unnecessary films including the mask pattern M2, which remain on the substrate 210, may be removed to expose a top surface of the substrate 210. The insulating capping pattern 296 may include, for example, a silicon nitride film.

Hereinafter, the inventive concept will be described in more detail with reference to Experimental examples. However, the following Experimental examples are provided in order to fully explain the inventive concept, and the scope of the inventive concept is not limited by the following Experimental examples.

Preparation Example 1 of Etchant Composition

Etchant compositions according to Experimental examples 1 to 21 were prepared based on components and contents shown in Table 1.

TABLE 1

| | Heterocyclic organic amine compound (wt %) | | | | | | | $H_2O_2$ (Purity of 31%) | $H_3PO_4$ (Purity of 85%) | DIW | Total sum |
|---|---|---|---|---|---|---|---|---|---|---|---|
| | A-1 | A-2 | A-3 | A-4 | A-5 | A-6 | A-7 | (wt %) | (wt %) | (wt %) | (wt %) |
| Experimental example 1 | 1 | | | | | | | 15 | 80 | 4 | 100 |
| Experimental example 2 | | 1 | | | | | | 15 | 80 | 4 | 100 |
| Experimental example 3 | | | 0.5 | | | | | 15 | 80 | 4.5 | 100 |
| Experimental example 4 | | | 1 | | | | | 15 | 80 | 4 | 100 |
| Experimental example 5 | | | 3 | | | | | 15 | 18 | 2 | 100 |
| Experimental example 6 | | | | 1 | | | | 5 | 92 | 2 | 100 |
| Experimental example 7 | | | | 1 | | | | 20 | 79 | 0 | 100 |
| Experimental example 8 | | | | 0.5 | | | | 3 | 95 | 1.5 | 100 |
| Experimental example 9 | | | | | 0.1 | | | 14 | 85 | 0.9 | 100 |
| Experimental example 10 | | | | | 0.5 | | | 20 | 75 | 4.5 | 100 |

TABLE 1-continued

| | Heterocyclic organic amine compound (wt %) | | | | | | | $H_2O_2$ (Purity of 31%) (wt %) | $H_3PO_4$ (Purity of 85%) (wt %) | DIW (wt %) | Total sum (wt %) |
|---|---|---|---|---|---|---|---|---|---|---|---|
| | A-1 | A-2 | A-3 | A-4 | A-5 | A-6 | A-7 | | | | |
| Experimental example 11 | | | | | 1 | | | 14 | 85 | 0 | 100 |
| Experimental example 12 | | | | | 3 | | | 12 | 85 | 0 | 100 |
| Experimental example 13 | | | | | | 0.1 | | 10 | 85 | 4.9 | 100 |
| Experimental example 14 | | | | | | 1 | | 10 | 85 | 4 | 100 |
| Experimental example 15 | | | | | | 5 | | 10 | 85 | 0 | 100 |
| Experimental example 16 | | | | | | | 0.1 | 20 | 75 | 4.9 | 100 |
| Experimental example 17 | | | | | | | 1 | 20 | 75 | 4 | 100 |
| Experimental example 18 | | | | | | | 5 | 20 | 75 | 0 | 100 |
| Experimental example 19 | 0.5 | | 0.5 | | | | | 15 | 80 | 4 | 100 |
| Experimental example 20 | | 0.005 | | | | | | 15 | 80 | 4.995 | 100 |
| Experimental example 21 | | | | 15 | | | | 15 | 60 | 10 | 100 |

Heterocyclic organic amine compounds used in Experimental examples 1 to 21 shown in Table 1 are as follows.
A-1: piperazine,
A-2: piperidine,
A-3: morpholine,
A-4: 2-methylpyrazine,
A-5: 4-(2-hydroxyethyl)morpholine,
A-6: 1-(2-hydroxyethyl)piperazine,
A-7: 1-(2-aminoethyl)piperazine.

Preparation Example 2 of Etchant Composition

Etchant compositions according to Comparative examples 1 to 8 were prepared based on components and contents shown in Table 2.

<Evaluation of Etch Rate Using Etchant Composition>

Etch rates of films including various materials were evaluated using the etchant compositions according to Experimental examples 1 to 21 shown in Table 1 and the

TABLE 2

| | Organic amine compound (wt %) | | | | | $H_2O_2$ (Purity of 31%) (wt %) | $H_3PO_4$ (Purity of 85%) (wt %) | DIW (wt %) | Total sum (wt %) |
|---|---|---|---|---|---|---|---|---|---|
| | B-1 | B-2 | B-3 | B-4 | B-5 | | | | |
| Comparative example 1 | | | | | | 0 | 100 | 0 | 100 |
| Comparative example 2 | | | | | | 5 | 95 | 0 | 100 |
| Comparative example 3 | | | | | | 100 | 0 | 0 | 100 |
| Comparative example 4 | 0.01 | | | | | 9 | 90.99 | 0 | 100 |
| Comparative example 5 | | 0.01 | | | | 9 | 90.99 | 0 | 100 |
| Comparative example 6 | | | 0.05 | | | 9 | 90.95 | 0 | 100 |
| Comparative example 7 | | | | 0.1 | | 10 | 89.9 | 0 | 100 |
| Comparative example 8 | | | | | 0.1 | 10 | 89.9 | 0 | 100 |

Organic amine compounds used in Comparative examples 1 to 8 shown in Table 2 are as follows.
B-1: poly(2-dimethyl aminoethyl methacrylate),
B-2: poly(N-methylvinylamine),
B-3: poly(allylamine),
B-4: 1,4-diaminobutane,
B-5: n-butylamine.

etchant compositions according to Comparative examples 1 to 8 shown in Table 2, and evaluation results are shown in Table 3.

TABLE 3

| | Etch rate (Å/min) | | | | Etch selectivity |
|---|---|---|---|---|---|
| | TiN film | W film | SiO$_2$ film | Si$_3$N$_4$ film | (TiN/W) |
| Experimental example 1 | 261.6 | 57.6 | 0 | 0 | 4.5 |
| Experimental example 2 | 220.0 | 101.4 | 0 | 0 | 2.2 |
| Experimental example 3 | 188.7 | 42.1 | 0 | 0 | 4.5 |
| Experimental example 4 | 152.0 | 23.0 | 0 | 0 | 6.6 |
| Experimental example 5 | 137.5 | 19.3 | 0 | 0 | 7.1 |
| Experimental example 6 | 178.7 | 26.8 | 0 | 0 | 6.6 |
| Experimental example 7 | 264.3 | 37.9 | 0 | 0 | 7.0 |
| Experimental example 8 | 246.5 | 39.4 | 0 | 0 | 6.2 |
| Experimental example 9 | 258.1 | 34.7 | 0 | 0 | 7.4 |
| Experimental example 10 | 266.4 | 59.2 | 0 | 0 | 4.5 |
| Experimental example 11 | 226.2 | 32.8 | 0 | 0 | 6.9 |
| Experimental example 12 | 160.8 | 24.5 | 0 | 0 | 6.6 |
| Experimental example 13 | 238.1 | 58.0 | 0 | 0 | 4.1 |
| Experimental example 14 | 207.6 | 47.6 | 0 | 0 | 4.4 |
| Experimental example 15 | 138.5 | 23.9 | 0 | 0 | 5.6 |
| Experimental example 16 | 288.7 | 70.1 | 0 | 0 | 4.1 |
| Experimental example 17 | 252.0 | 36.0 | 0 | 0 | 7.0 |
| Experimental example 18 | 237.5 | 29.3 | 0 | 0 | 8.1 |
| Experimental example 19 | 149.5 | 37.5 | 0 | 0 | 4.0 |
| Experimental example 20 | 288.0 | 136.8 | 0 | 0 | 2.1 |
| Experimental example 21 | 307.2 | 120.8 | 0 | 0 | 2.5 |
| Comparative example 1 | 1.2 | 2.7 | 0 | 0 | 0.4 |
| Comparative example 2 | 49.3 | 50.0 | 0 | 0 | 1.0 |
| Comparative example 3 | 191.8 | 322.4 | 0 | 0 | 0.6 |
| Comparative example 4 | 16 | 6 | 0 | 0 | 2.7 |
| Comparative example 5 | 18 | 8 | 0 | 0 | 2.3 |
| Comparative example 6 | 21 | 9 | 0 | 0 | 2.3 |
| Comparative example 7 | 42 | 55 | 0 | 0 | 0.8 |
| Comparative example 8 | 47 | 70 | 0 | 0 | 0.7 |

Referring to the results shown in Table 3, when a TiN film was etched using the etchant compositions according to Experimental examples 1 to 21, the TiN film was etched at a sufficient etch rate of 100 Å/min or more. In particular, when the etchant compositions according to Experimental examples 1 to 19 were used, an etch rate of the TiN film was higher than an etch rate of a W film. When the etchant compositions according to Experimental examples 1 and 3 to 19 were used, an etch selectivity of the TiN with respect to the W film was 4.0 or higher. In addition, when the etchant compositions according to Experimental examples 1 to 21 were used, an etch rate of each of a SiO$_2$ film and a Si$_3$N$_4$ film was about 0 Å/min within the measurement limit.

From the results shown in Table 3, it can be seen that the selective etching of the TiN film and the W film may be effectively performed using the etchant composition according to some embodiments in a state where the TiN film and the W film are exposed to an etching atmosphere together with a Si-containing insulating film.

While the inventive concept has been particularly shown and described with reference to some example embodiments thereof, it will be understood that various changes in form and details may be made therein without departing from the scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A metal-containing film etchant composition comprising:
   aqueous hydrogen peroxide (H$_2$O$_2$.nH$_2$O);
   a phosphoric acid compound; and
   a heterocyclic organic amine compound comprising at least one heteroatom in a ring,
   wherein the aqueous hydrogen peroxide has a purity of 31%, and the phosphoric acid compound comprises phosphoric acid having a purity of 85%, and
   wherein the sum of a content of the aqueous hydrogen peroxide and a content of the phosphoric acid compound is about 95% by weight to about 99% by weight based on a total weight of the metal-containing film etchant composition.

2. The metal-containing film etchant composition of claim 1, wherein the phosphoric acid compound comprises phosphoric acid (H$_3$PO$_4$), pyrophosphoric acid (H$_4$P$_2$O$_7$), polyphosphoric acid, or a combination thereof.

3. The metal-containing film etchant composition of claim 1, wherein the heterocyclic organic amine compound comprises a six-membered heterocyclic organic tertiary amine compound comprising two heteroatoms in the ring.

4. The metal-containing film etchant composition of claim 1, wherein the heterocyclic organic amine compound is a compound of Formula I:

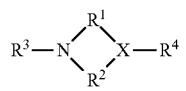

[Formula I]

wherein R$^1$ and R$^2$ are each independently —(CH$_2$)$_2$— or —(CR'H)$_2$—, and R' is a hydrogen atom or C1-C2 alkyl group,
wherein R$^3$ and R$^4$ are each independently a hydrogen atom, C1-C4 alkyl group, C1-C4 hydroxyalkyl group, or C1-C4 aminoalkyl group, and optionally wherein at least one of R$^3$ and R$^4$ is absent, and
wherein X is a nitrogen atom (N), oxygen atom (O), or carbon atom (C) and forms a six-membered heterocyclic organic amine compound together with R$^1$ and R$^2$.

5. The metal-containing film etchant composition of claim 1, wherein the metal-containing film etchant composition comprises:

about 3% by weight to about 20% by weight of the aqueous hydrogen peroxide based on the total weight of the metal-containing film etchant composition;

about 75% by weight to about 95% by weight of the phosphoric acid compound based on the total weight of the metal-containing film etchant composition; and about 0.01% by weight to about 10% by weight of the heterocyclic organic amine compound based on the total weight of the metal-containing film etchant composition.

6. The metal-containing film etchant composition of claim 1, wherein the heterocyclic organic amine compound comprises piperidine, piperidine derivatives, pyrazine, pyrazine derivatives, or a combination thereof.

7. The metal-containing film etchant composition of claim 1, wherein the heterocyclic organic amine compound comprises piperazine, 1-(2-hydroxyethyl)piperazine, 1-(2-aminoethyl)piperazine, piperidine, morpholine, 4-(2-hydroxyethyl)morpholine, or 2-methylpyrazine, and the metal-containing film etchant composition comprises about 0.1% by weight to about 5% by weight of the heterocyclic organic amine compound based on the total weight of the metal-containing film etchant composition.

8. The metal-containing film etchant composition of claim 1, wherein the metal-containing film etchant composition consists essentially of the aqueous hydrogen peroxide, the phosphoric acid compound, and the heterocyclic organic amine compound.

9. A metal-containing film etchant composition comprising: aqueous hydrogen peroxide ($H_2O_2 \cdot nH_2O$);
a phosphoric acid compound; and
a heterocyclic organic amine compound comprising two heteroatoms in a ring,
wherein the aqueous hydrogen peroxide has a purity of 31%, and the phosphoric acid compound comprises phosphoric acid having a purity of 85%, and
wherein the sum of a content of the aqueous hydrogen peroxide and a content of the phosphoric acid compound is about 95% by weight to about 99% by weight based on a total weight of the metal-containing film etchant composition.

10. The metal-containing film etchant composition of claim 9, wherein the heterocyclic organic amine compound comprises piperidine, piperidine derivatives, pyrazine derivatives, or a combination thereof.

11. The metal-containing film etchant composition of claim 9, wherein the phosphoric acid compound comprises phosphoric acid ($H_3PO_4$), pyrophosphoric acid ($H_4P_2O_7$), polyphosphoric acid, or a combination thereof.

12. The metal-containing film etchant composition of claim 9, wherein the heterocyclic organic amine compound is a compound of Formula I:

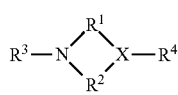

[Formula I]

wherein $R^1$ and $R^2$ are each independently —$(CH_2)_2$— or —$(CR'H)_2$—, and R' is a hydrogen atom or C1-C2 alkyl group,
wherein $R^3$ and $R^4$ are each independently a hydrogen atom, C1-C4 alkyl group, C1-C4 hydroxyalkyl group, or C1-C4 aminoalkyl group, and optionally wherein at least one of $R^3$ and $R^4$ is absent, and
wherein X is a nitrogen atom (N) or oxygen atom (O) and forms a six-membered heterocyclic organic amine compound together with $R^1$ and $R^2$.

13. The metal-containing film etchant composition of claim 9,
wherein the metal-containing film etchant composition comprises:
about 3% by weight to about 20% by weight of the aqueous hydrogen peroxide based on the total weight of the metal-containing film etchant, composition;
about 75% by weight to about 95% by weight of the phosphoric acid based on the total weight of the metal-containing film etchant composition; and
about 0.01% by weight to about 10% by weight of the heterocyclic organic amine compound based on the total weight of the metal-containing film etchant composition.

14. The metal-containing film etchant composition of claim 9, wherein the metal-containing film etchant, composition is devoid of sulfuric acid.

15. The metal-containing film etchant composition of claim 9, wherein the metal-containing film etchant composition consists essentially of the aqueous hydrogen peroxide, the phosphoric acid compound, and the heterocyclic organic amine compound.

16. A metal-containing film etchant composition comprising:
about 3% by weight to about 20% by weight of aqueous hydrogen peroxide having a purity of 31% based on a total weight of the metal-containing film etchant composition;
about 75% by weight to about 95% by weight of phosphoric acid compound comprising phosphoric acid having a purity of 85% based on the total weight of the metal-containing film etchant composition; and
about 0.01% by weight to about 10% by weight of a heterocyclic organic amine compound based on the total weight of the metal-containing film etchant composition,
wherein the heterocyclic organic amine compound comprises a six-membered heterocyclic organic tertiary amine compound comprising at least one nitrogen atom in a ring, and
wherein the sum of a content of the aqueous hydrogen peroxide and a content of the phosphoric acid compound is about 95% by weight to about 99% by weight based on the total weight of the metal-containing film etchant composition.

17. The metal-containing film etchant composition of claim 16, wherein the heterocyclic organic amine compound comprises piperidine, piperidine derivatives, pyrazine, pyrazine derivatives, or a combination thereof.

18. The metal-containing film etchant composition of claim 16, wherein the heterocyclic organic amine compound is a compound of Formula I:

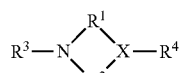

[Formula I]

wherein:

$R^1$ and $R^2$ are each independently —$(CH_2)_2$— or —$(CR'H)_2$—, and R' is a hydrogen atom or C1-C2 alkyl group;

$R^3$ and $R^4$ are each independently a hydrogen atom, C1-C4 alkyl group, C1-C4 hydroxyalkyl group, or C1-C4 aminoalkyl group, and optionally wherein at least one of $R^3$ and $R^4$ is absent; and X is a nitrogen atom (N), oxygen atom (O), or carbon atom (C) and forms a six-membered heterocyclic organic amine compound together with $R^1$ and $R^2$.

19. The metal-containing film etchant composition of claim 16, wherein the metal-containing film etchant composition is devoid of sulfuric acid.

20. The metal-containing film etchant composition of claim 16, wherein the metal-containing film etchant composition consists essentially of the aqueous hydrogen peroxide, the phosphoric acid compound, and the heterocyclic organic amine compound.

* * * * *